United States Patent
Yabe

(10) Patent No.: US 11,250,920 B2
(45) Date of Patent: Feb. 15, 2022

(54) LOOP-DEPENDENT SWITCHING BETWEEN PROGRAM-VERIFY TECHNIQUES

(71) Applicant: SanDisk Technologies LLC, Addison, TX (US)

(72) Inventor: Hiroki Yabe, Yokohama (JP)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/916,367

(22) Filed: Jun. 30, 2020

(65) Prior Publication Data

US 2021/0407604 A1    Dec. 30, 2021

(51) Int. Cl.
| | | |
|---|---|---|
| *G11C 16/06* | (2006.01) | |
| *G11C 16/34* | (2006.01) | |
| *G11C 16/10* | (2006.01) | |
| *G06F 9/30* | (2018.01) | |
| *G11C 16/30* | (2006.01) | |
| *G11C 16/08* | (2006.01) | |

(52) U.S. Cl.
CPC ...... *G11C 16/3459* (2013.01); *G06F 9/30101* (2013.01); *G06F 9/30189* (2013.01); *G11C 16/08* (2013.01); *G11C 16/10* (2013.01); *G11C 16/30* (2013.01); *G11C 16/3495* (2013.01)

(58) Field of Classification Search
CPC ..... G11C 16/3459; G11C 16/08; G11C 16/10; G11C 16/30; G11C 16/3495; G06F 9/30101; G06F 9/30189
See application file for complete search history.

(56) References Cited

U.S. PATENT DOCUMENTS

| | | | | |
|---|---|---|---|---|
| 9,257,191 B1* | 2/2016 | Yuan | ............... | G11C 16/3445 |
| 10,153,051 B1* | 12/2018 | Chen | ............... | G11C 11/5628 |
| 10,726,929 B1* | 7/2020 | Yang | ............... | G11C 11/5628 |
| 2009/0010068 A1* | 1/2009 | Lee | ............... | G11C 11/5642 |
| | | | | 365/185.19 |
| 2014/0219027 A1* | 8/2014 | Dong | ............... | G11C 16/3427 |
| | | | | 365/185.17 |
| 2015/0206593 A1* | 7/2015 | Khandelwal | ....... | G11C 16/3459 |
| | | | | 365/185.22 |
| 2017/0076812 A1* | 3/2017 | Chu | ............... | G11C 11/5642 |
| 2017/0125117 A1* | 5/2017 | Tseng | ............... | G11C 11/5628 |
| 2019/0378580 A1* | 12/2019 | Zhao | ............... | G11C 7/04 |

* cited by examiner

*Primary Examiner* — Tuan T Nguyen
(74) *Attorney, Agent, or Firm* — Dickinson Wright PLLC; Steven C. Hurles

(57) ABSTRACT

A storage device for verifying whether memory cells have been programmed. The storage device may be configured to use a verification technique, that is part of a set of verification techniques, to verify data states of a set of memory cells of a selected word line. The one or more verification techniques may be utilized based on an iteration of the verify operation that is to be performed. The storage device may be further configured to perform, using the verification technique, a next iteration of the program-verify operation to verify whether one or more memory cells have been programmed. Using the verification technique and performing the next-iteration of the program-verify operation are to be repeated until the set of memory cells have been verified.

20 Claims, 24 Drawing Sheets

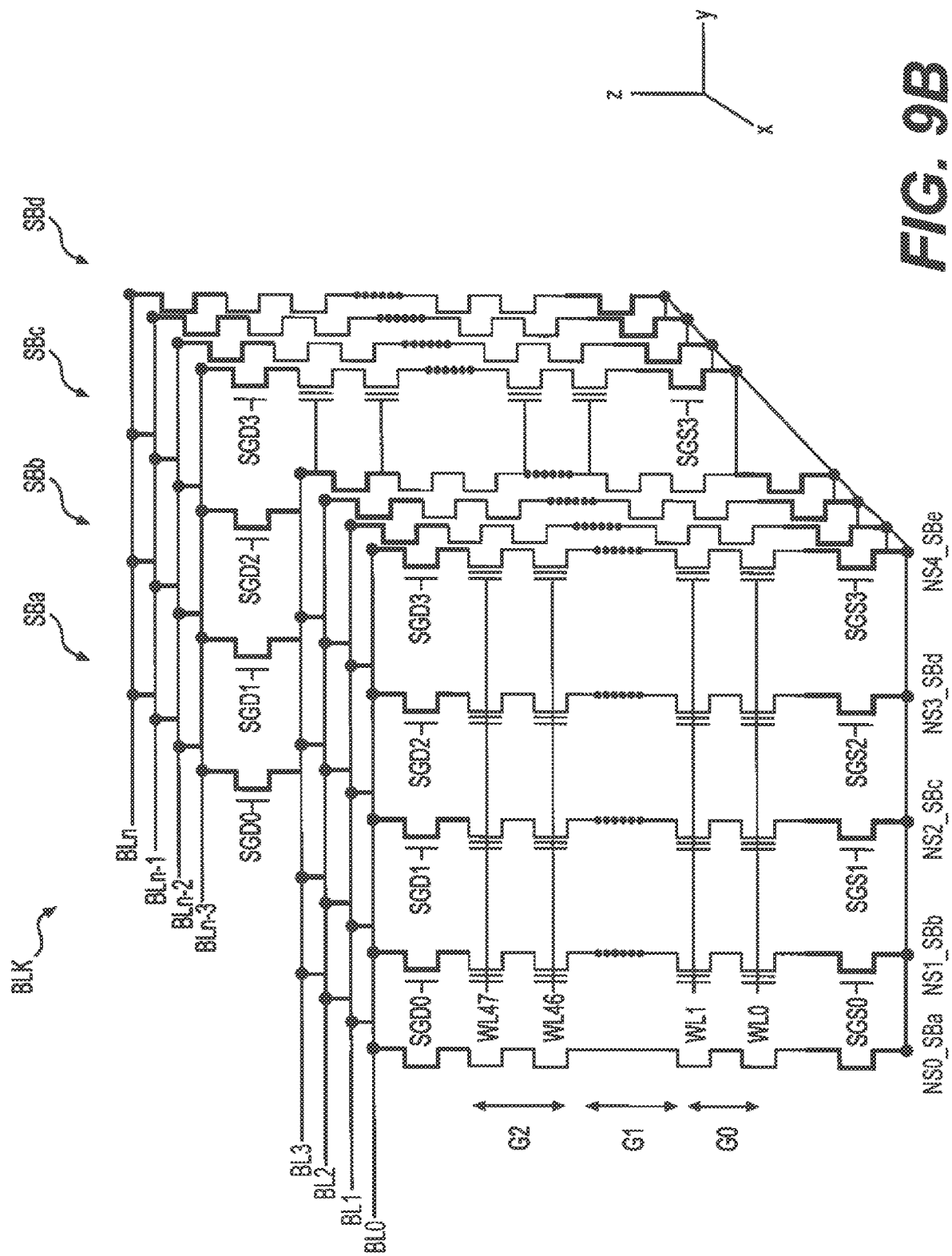

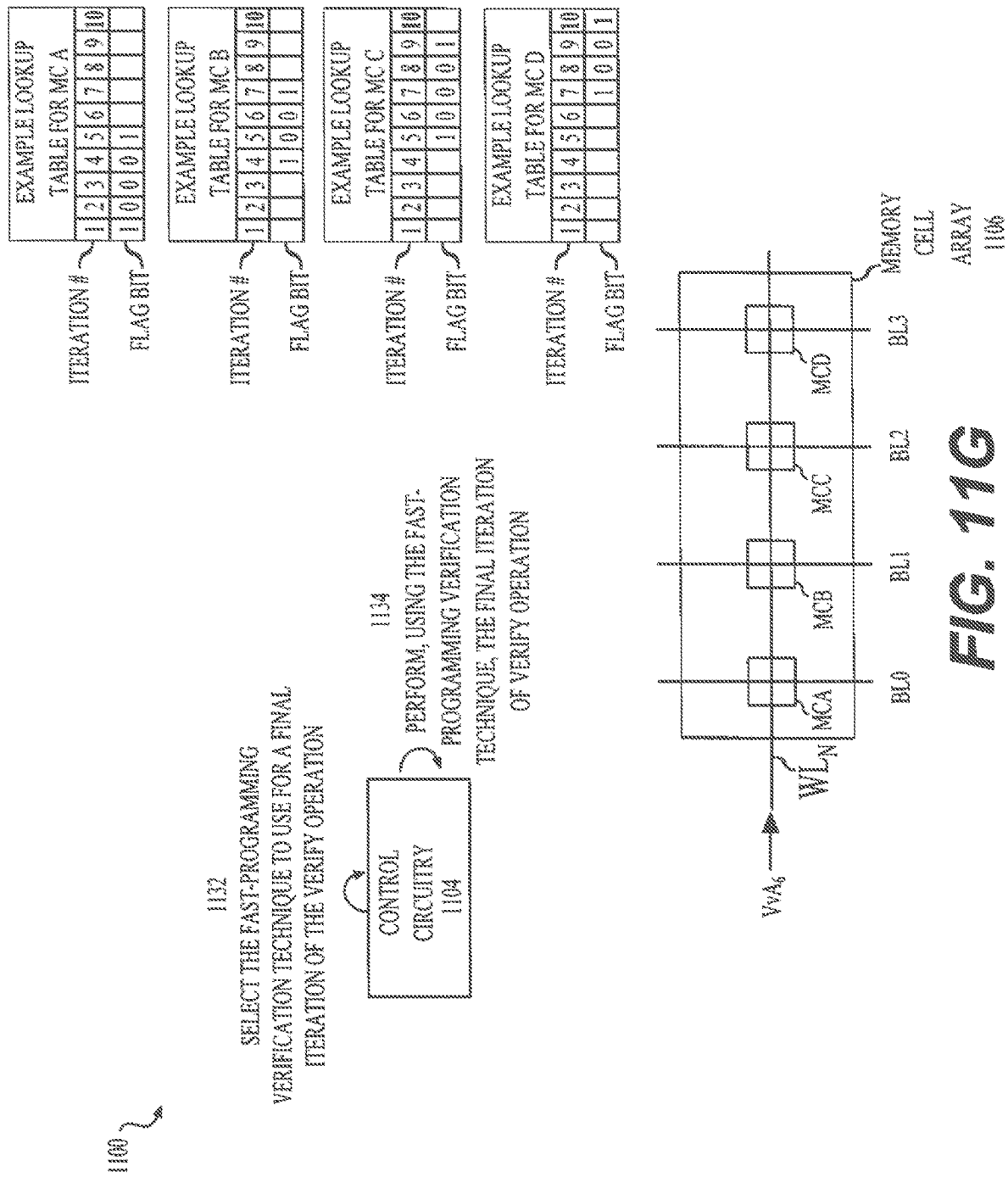

LOOP-DEPENDENT SWITCHING BETWEEN PROGRAM-VERIFY TECHNIQUES

BACKGROUND

The present technology relates to the operation of memory devices.

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), an electrically erasable programmable read-only memory (EEPROM), a flash memory, and/or the like. In an EEPROM or flash NAND array architecture, memory cells may be arranged in a matrix of rows and columns, such that gates of each memory cell are coupled by rows to word lines. The memory cells may be arranged together in strings such that memory cells in a given string are coupled together in series, from source to drain, between a common source line and a common bit line.

SUMMARY

One aspect of the present invention is related to a storage device for verifying whether memory cells have been programmed. The memory cells may be part of an array of memory cells of a non-volatile memory. The control circuitry may be configured to use a verification technique, that is part of a set of verification techniques, to verify data states of a set of memory cells of a selected word line. The one or more verification techniques may be utilized based on an iteration of the verify operation that is to be performed. The storage device may be further configured to perform, using the verification technique, a next iteration of the program-verify operation to verify whether one or more memory cells have been programmed. Using the verification technique and performing the next-iteration of the program-verify operation may be repeated until the set of memory cells have been verified.

Another aspect of the present invention is related to method of verifying whether one or more memory cells of a non-volatile memory have been programmed. The method includes utilizing one or more verification techniques, that are part of a set of verification techniques, to verify data states of a set of memory cells of a selected word line. The one or more verification techniques may be selected for use based on an iteration of the verify operation that is to be performed. The method further includes performing, using the one or more verification techniques, a next-iteration of the program-verify operation to verify whether one or more memory cells are programmed, wherein using the one or more verification techniques and performing the next-iteration of the program-verify operation are to be repeated until the set of memory cells have been verified.

Yet another aspect of the present invention is related to a non-volatile memory device comprising control circuitry for verifying whether memory cells have been programmed. The memory cells may be part of an array of memory cells of non-volatile memory. The control circuitry may be configured to use one or more verification techniques as part of a program-verify operation that is to be performed on one or more memory cells that are part of a set of memory cells of a selected word line. The verification technique may be utilized based on an iteration of the verify operation that is to be performed. The control circuitry may perform, using the one or more verification techniques, a next-iteration of the program-verify operation to verify whether the one or more memory cells are programmed. Using the one or more verification techniques and performing the next-iteration of the program-verify operation may be repeated until the set of memory cells have been verified.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

FIG. 9B illustrates another example view of NAND strings in sub-blocks.

FIGS. 11A-11G illustrate an example memory device for verifying whether memory cells have been programmed by selectively switching between different types of verification techniques.

DETAILED DESCRIPTION

Figure 1A:
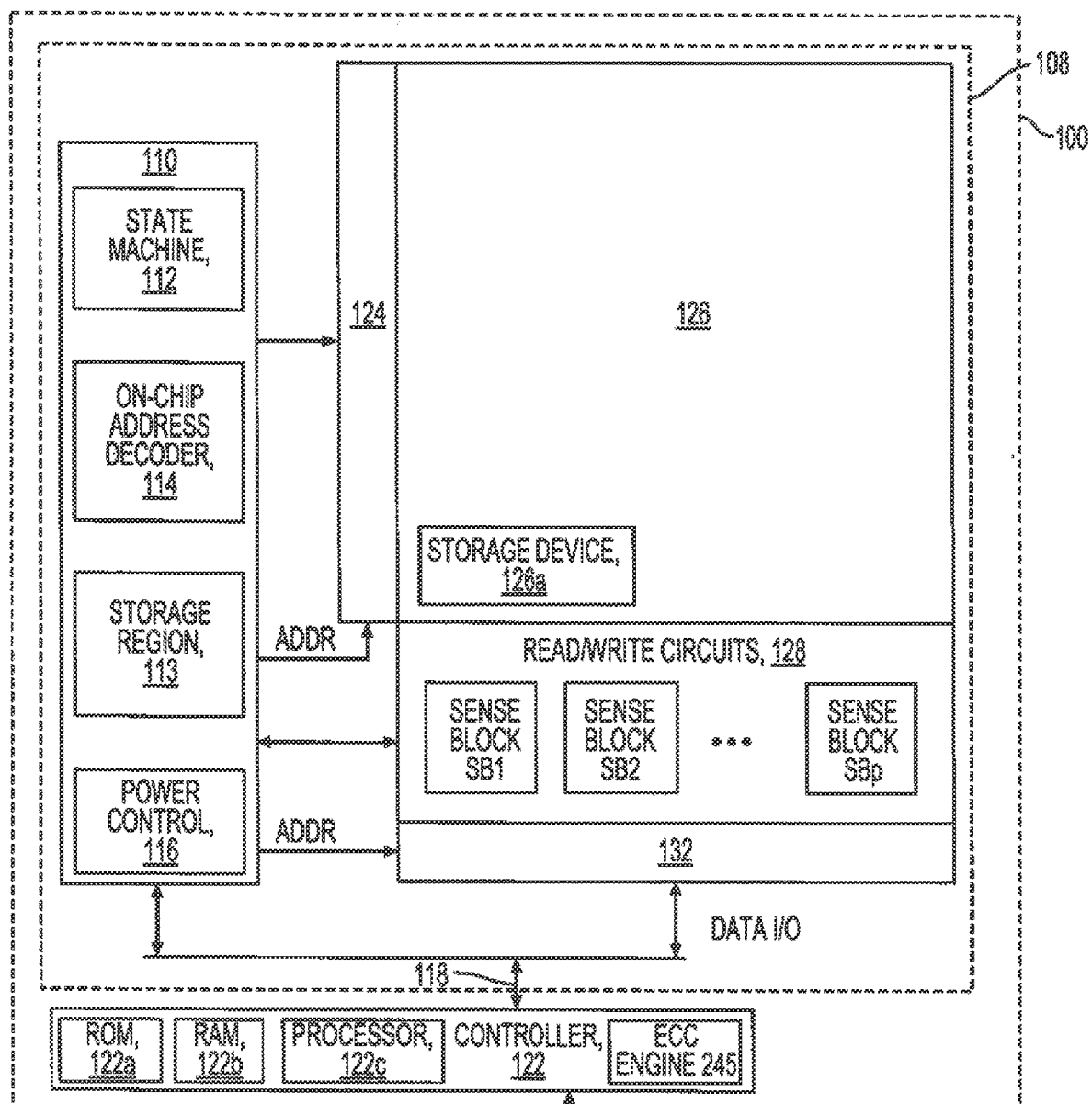
FIG. 1A illustrates a block diagram of an example memory device.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As described, in an EEPROM or flash NAND array architecture, memory cells may be arranged in a matrix of rows and columns, such that gates of each memory cell are coupled by rows to word lines. The memory cells may be arranged together in an array of strings such that memory cells in a given string are coupled together in series, from source to drain, between a common source line and a common bit line.

To program memory cells included in the array of memory strings, a programming operation may be performed to apply a series of program voltages to the memory cells after the memory cells are provided in an erased state. Each program voltage is provided in a program loop, also referred to as a program-verify iteration. For example, the program voltage may be applied to a word line which is connected to control gates of the memory cells. In one approach, incremental step pulse programming is performed, where the program voltage is increased by a step size in each program loop. When programming is completed for a memory cell, it can be locked out from further programming while programming continues for other memory cells in subsequent program loops.

Each memory cell may be associated with a data state according to write data in a program command. A memory cell can be in an erased data state (referred to herein as an erased state) or can be programmed to a programmed data state (referred to herein as a programmed state) that is different from the erased state. For example, in a two-bit per cell memory device, there are four data states including the erased state and three programmed data states referred to as the A, B and C data states (see FIG. 9). In a three-bit per cell memory device, there are eight data states including the erased state and seven programmed data states referred to as the A, B, C, D, E, F and G data states (see FIG. 10). In a four-bit per cell memory device, there are sixteen data states including the erased state and fifteen programmed data states referred to as the Er, 1, 2, 3, 4, 5, 6, 7, 8, 9, A, B, C, D, E and F data states (see FIG. 10).

When a program command is issued, the write data is stored in latches associated with the memory cells. During programming, the latches of a memory cell can be read to determine the data state to which the cell is to be programmed. Each memory cell is considered to have completed programming when a sensing operation determines that a threshold voltage (Vth) is satisfied by (e.g., above) the associated verify voltage. A sensing operation can determine whether a memory cell has a Vth above the associated verify voltage by applying the associated verify voltage to the control gate and sensing a current through the memory cell. If the current is relatively high, this indicates the memory cell is in a conductive state, such that the Vth is less than the control gate voltage. If the current is relatively low, this indicates the memory cell is in a non-conductive state, such that the Vth is above the control gate voltage.

When programming memory cells, it is important to perform a program-verify operation in a way that is both fast and accurate. As described below, many techniques or configurations are able to achieve fast programming, or accurate programming, but are unable to achieve both. To program memory cells accurately, a Vth distribution for each data state must be sufficiently spaced apart. This reduces the likelihood of a higher voltage of one Vth distribution overlapping with a voltage of another Vth distribution. This overlap can occur because of disturbances, such as noise, variance in temperature of the integrated circuit, and/or the like. Furthermore, overlap in Vth distributions can lead to run-time errors (e.g., a bit with a value of zero could be mistakenly read as having a value of one). Consequently, it is useful to have narrow Vth distributions that are less likely to be impacted by disturbances and less likely to cause run-time errors.

However, controlling Vth distribution width can be difficult given that memory cells program at different rates. For example, a first memory cell that programs faster than a second memory cell will require less programming pulses to complete programming. This causes a first Vth distribution for the first memory cell to be different than a second Vth distribution for the second memory cell. This may bring the Vth distributions closer together, thereby increasing a likelihood of memory cells being impacted by disturbances.

One solution is to implement a multistep verify (MSV) operation. The MSV operation is a two-step operation, where a different verify voltage is applied during each step. Once a threshold voltage for a memory cell reaches a first verify voltage, a control voltage is changed to slow down the faster-programmed memory cells. However, an MSV operation may result in degraded performance (e.g., relative to one-step programming operations) due to electron migration or disturbance on the memory cells. Furthermore, the MSV operation is inefficient as it requires an additional step in order to program the memory cells.

Another solution to create narrower Vth distributions is to implement a quick pass write (QPW) technique. The QPW technique involves adjusting a programming pulse step voltage as a memory cell approaches a programmed state. Thus, when a faster-programming memory cell is within a threshold range of the programmed state, the programming pulse step voltage is adjusted to slow the rate at which the memory cell is programmed. However, this slows the programming of all bits that remain to be programmed, thus increasing the total programming time.

Some modifications to the QPW technique allow for faster programming times but at the expense of accuracy. Rough QPW techniques may include a smart QPW (SQPW) operation, a floating QPW (FQPW) technique, and/or the like. To provide an example, an SQPW technique may involve skipping a portion of a verify operation in order to reduce overall time to program the memory cells. However, skipping portions of the verify operation may reduce accuracy of the programming, thereby increasing a likelihood of the memory cells being impacted by disturbances that can lead to run-time errors.

For these reasons, and other reasons that will become apparent to one of ordinary skill in the art upon reading the present specification and corresponding figures, there is a need in the art for a way to create narrow Vth distributions without reducing programming throughput of the memory device.

Some embodiments, described herein, may include systems and/or methods for performing iterations of a verify operation to verify data states of memory cells in a selected word line, where a fast-programming verification technique or a precision-based verification technique is selected and implemented for each iteration of the verify operation. For example, the systems and/or methods may select a verification technique (e.g., the fast-programming verification technique or the precision-based verification technique) based on an iteration of the verify operation that is being performed, based on whether positions of memory cells are part of an upper or lower tail of a natural threshold voltage distribution (NVD) (e.g., use fast-programming verification technique) or part of a middle portion of the NVD (e.g., use precision-based verification technique), and/or the like.

In this way, the systems and/or methods described herein are able to efficiently and effectively narrow the Vth distributions of the memory cells. Furthermore, the systems and/or methods conserve resources (e.g., processing resources, memory resources, and/or the like) by reducing program-verify operation execution time relative to an inferior system or method (e.g., that utilizes only the fast-programming verification technique or only the precision-based verification technique). Reducing a total program-verify time conserves resources (e.g., power resources, processing resources, memory resources, and/or the like) that would have otherwise be expended programming and verifying the memory cells using only the precision-based verification technique.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, ..., SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, ..., SBp, read/write circuits 128, controller 122, and so forth.

The control circuits can include a programming circuit configured to perform a programming operation for one set of memory cells, wherein the one set of memory cells comprises memory cells assigned to represent one data state among a plurality of data states and memory cells assigned to represent another data state among the plurality of data states; the programming operation comprising a plurality of program-verify iterations; and in each program-verify iteration, the programming circuit performs programming for the one word line after which the programming circuit applies a verification signal to the one word line. The control circuits can also include a counting circuit configured to obtain a count of memory cells which pass a verify test for the one data state. The control circuits can also include a determination circuit configured to determine, based on an amount by which the count exceeds a threshold, a particular program-verify iteration among the plurality of program-verify iterations in which to perform a verify test for the another data state for the memory cells assigned to represent the another data state.

Figure 1B:
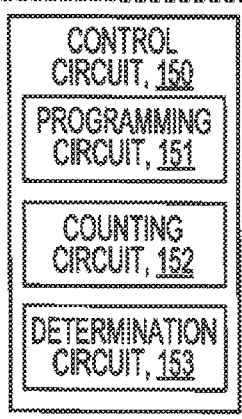
FIG. 1B illustrates a block diagram of an example control circuit which comprises a programming circuit, a counting circuit, and a determination circuit.

For example, FIG. 1B is a block diagram of an example control circuit 150 which comprises a programming circuit 151, a counting circuit 152 and a determination circuit 153.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exists in some cases. The techniques provided herein reduce the likelihood of uncorrectable errors.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Figure 2:
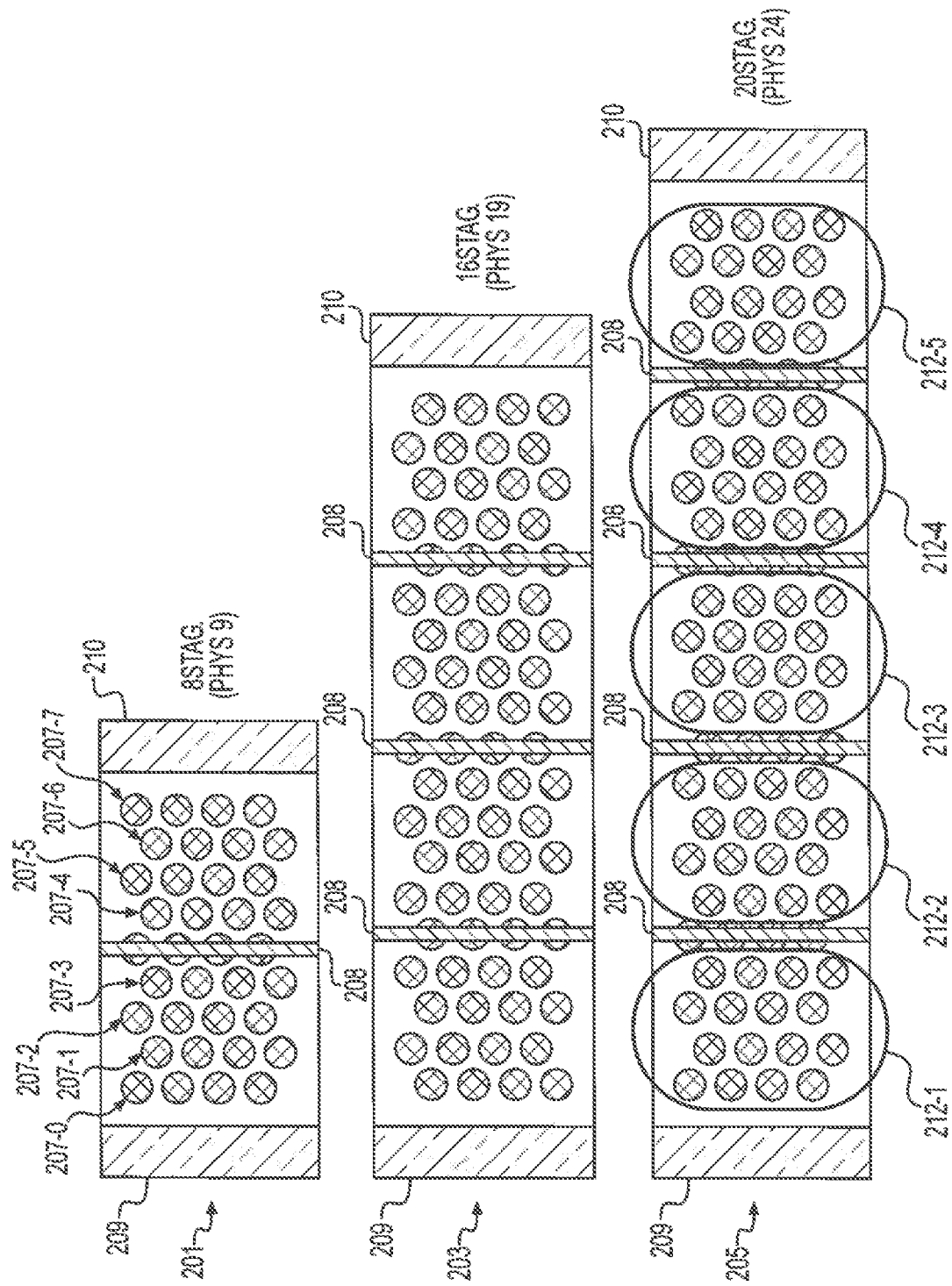
FIG. 2 illustrates a schematic view of three memory string architectures according to the principles of the present disclosure.

FIG. 2 illustrates a schematic view of example BiCS memory architectures utilizing staggered memory strings. For example, reference number 201 shows a schematic view of an example BiCS 4 memory architecture, reference number 203 shows a schematic view of an example BiCS 5 memory architecture, and reference number 205 shows a schematic view of an example BiCS 6 memory architecture. In some embodiments, as shown, a BiCS memory architecture may include an array of staggered NAND strings.

With reference to memory architecture 201, the memory strings are shown in rows 207-0 through 207-7 in string architecture 201. A memory string may include a set of memory cells (e.g., which correspond to a set of memory holes). Each row is shown with four ends to the memory strings. A memory string may be connected to an adjacent string at an end (not visible beneath this view). A first group of rows 207-0 through 207-3 of shown on a left side of a dummy row 208. A second group of rows 207-4 through 207-7 of shown on a right side of the dummy row 208. The dummy row 208 separates the two groups of rows in the staggered eight row. A source line 209 is positioned at an edge of the first group and is remote from the dummy row 208. A source line 210 is positioned at an edge of the second group and is remote from the dummy row 208 and source line 209.

The memory architectures 203 and 205 may be similar to that of string architecture 201 except additional groups are added. String architecture 203 may be double the size of architecture 201 and may include sixteen rows of strings with each group of four rows separated by a dummy row. String architecture 205 may be larger than both the memory architecture 201 and the memory architecture 203. String architecture 205 may include twenty rows of strings with each group of four rows separated by a dummy row 208.

In some embodiments, memory architectures 201, 203, and/or 205 may include a chip under array structure. For example, memory architectures 201, 203, and/or 205 may include a chip under array structure whereby the control circuitry is under the memory array that includes the groups of memory strings. With the chip under array structure, the memory strings may include a direct strap contact for the source line for read and erase operations.

In some embodiments, the memory architecture 205 may be a BiCS 6 memory architecture. For example, in a BiCS 6 memory architecture, there may be five NAND string groups. NAND string group 212-1, NAND string group 212-2, NAND string group 212-3, NAND string group 212-3, and NAND string group 212-4). NAND string group 212-0 and NAND string group 212-4 may be referred to as outer NAND string groups. NAND string group 212-1, NAND string group 212-2, and NAND string group 212-3 may be referred to collectively as inner NAND string groups. NAND string group 212-2 may be referred to as an inner-most NAND string group.

In some embodiments, the BiCS 6 memory architecture may be a 3-D memory architecture that includes one or more 3-D blocks. In this case, a 3-D block may be logically segmented into multiple sub-blocks corresponding to NAND string groups. The 3-D block may also be segmented into multiple planes. Additional block description is provided further herein.

While one or more embodiments refer to a BiCS memory architecture, it is to be understood that this is provided by way of example. In practice, the techniques described herein may be implemented on any number of different memory architectures, such as pipe-shaped BiCS (P-BiCS), a vertical recess array transistor (VRAT) architecture, and/or any other type of EEPROM or flash memory architecture.

Figure 3:
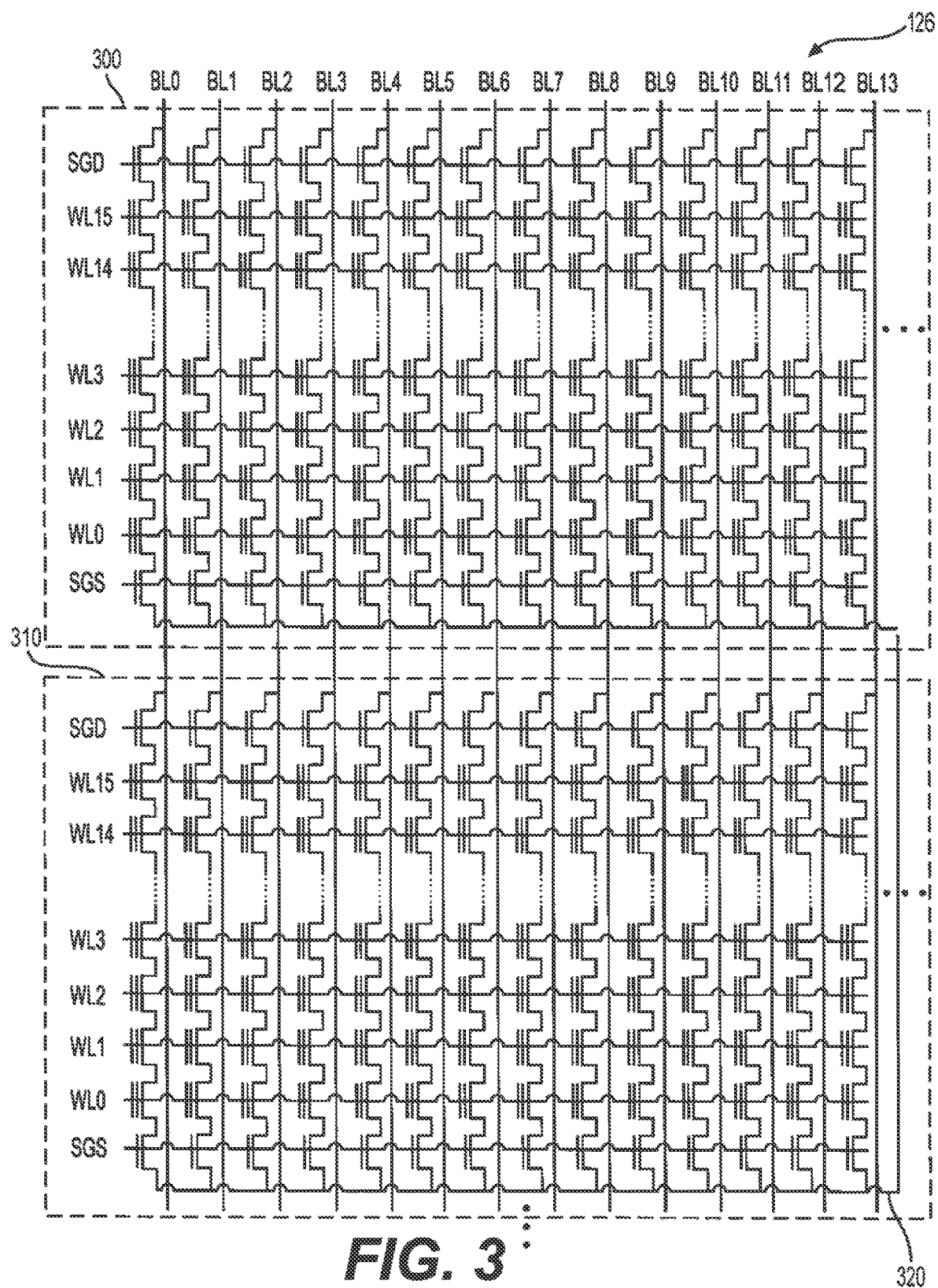
FIG. 3 illustrates blocks of memory cells in an example two-dimensional configuration of the memory array of FIG. 1.

FIG. 3 illustrates blocks of memory cells in an example two-dimensional configuration of the memory array 126 of FIG. 1. The memory array can include many blocks. Each example block 300, 310 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 320. Sixteen word lines, for example, WL0-WL15, extend between the source select gates and the drain select gates. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory. See FIGS. 4A and 4B. Other types of non-volatile memory can also be used. For example, a charge-trapping memory cell uses a non-conductive dielectric material in place of a conductive floating gate to store charge in a non-volatile manner. See FIGS. 5A and 5B. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 4A:
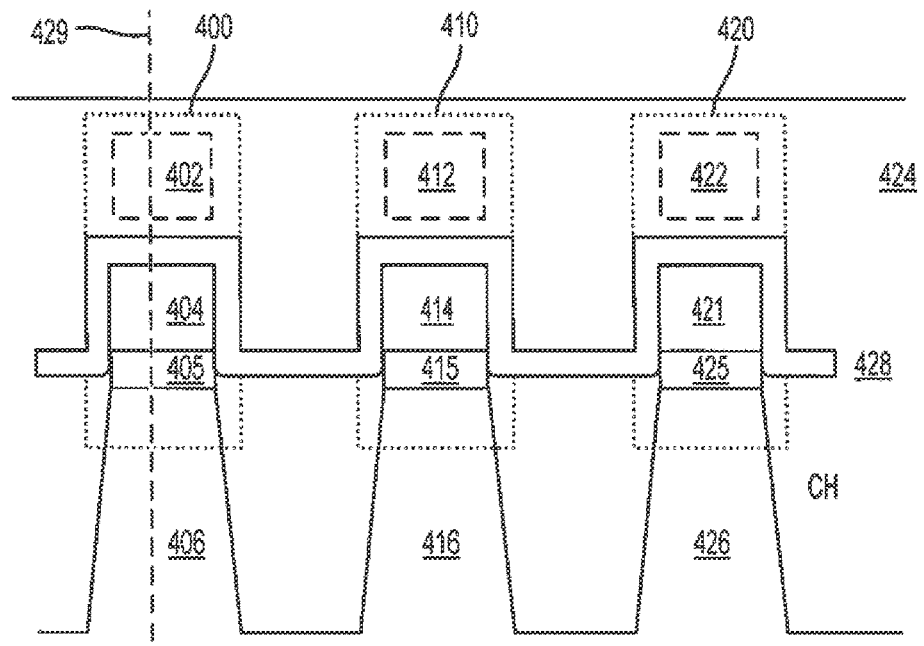
FIG. 4A illustrates a cross-sectional view of example floating gate memory cells in NAND strings.
Figure 4B:
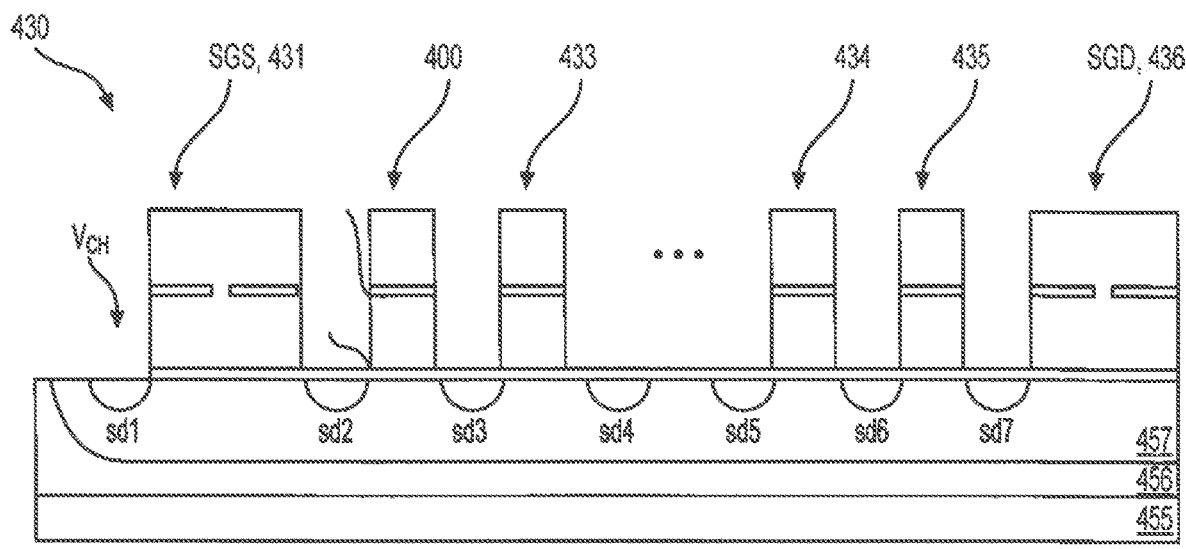
FIG. 4B illustrates a cross-sectional view of the structure of FIG. 4A along line 429.

FIG. 4A illustrates a cross-sectional view of example floating gate memory cells in NAND strings. A bit line or NAND string direction goes into the page, and a word line direction goes from left to right. As an example, word line 424 extends across NAND strings which include respective channel regions 406, 416 and 426. The memory cell 400 includes a control gate 402, a floating gate 404, a tunnel oxide layer 405 and the channel region 406. The memory cell 410 includes a control gate 412, a floating gate 414, a tunnel oxide layer 415 and the channel region 416. The memory cell 420 includes a control gate 422, a floating gate 421, a tunnel oxide layer 425 and the channel region 426. Each memory cell is in a different respective NAND string. An inter-poly dielectric (IPD) layer 428 is also illustrated. The control gates are portions of the word line. A cross-sectional view along contact line connector 429 is provided in FIG. 4B.

The control gate wraps around the floating gate, increasing the surface contact area between the control gate and floating gate. This results in higher IPD capacitance, leading to a higher coupling ratio which makes programming and erase easier. However, as NAND memory devices are scaled down, the spacing between neighboring cells becomes smaller so there is almost no space for the control gate and the IPD between two adjacent floating gates.

Figure 5A:
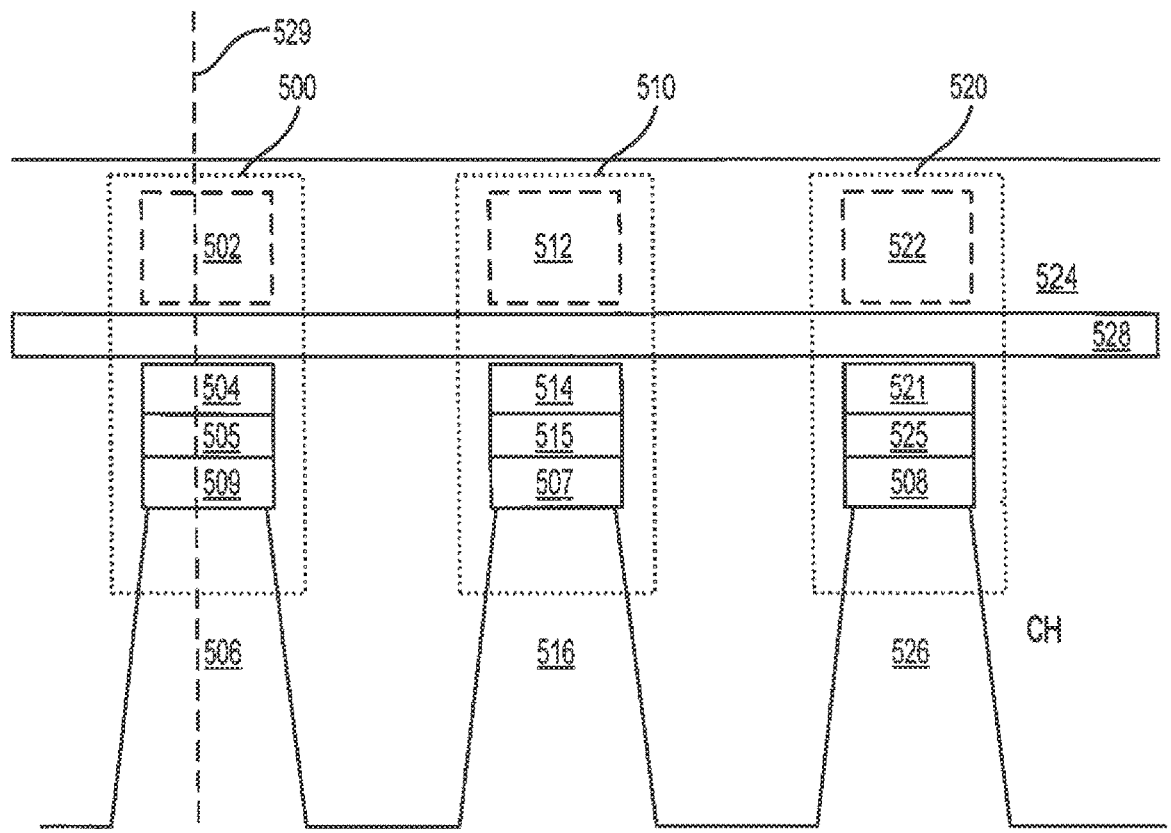
FIG. 5A illustrates a cross-sectional view of example charge-trapping memory cells in NAND strings.
Figure 5B:
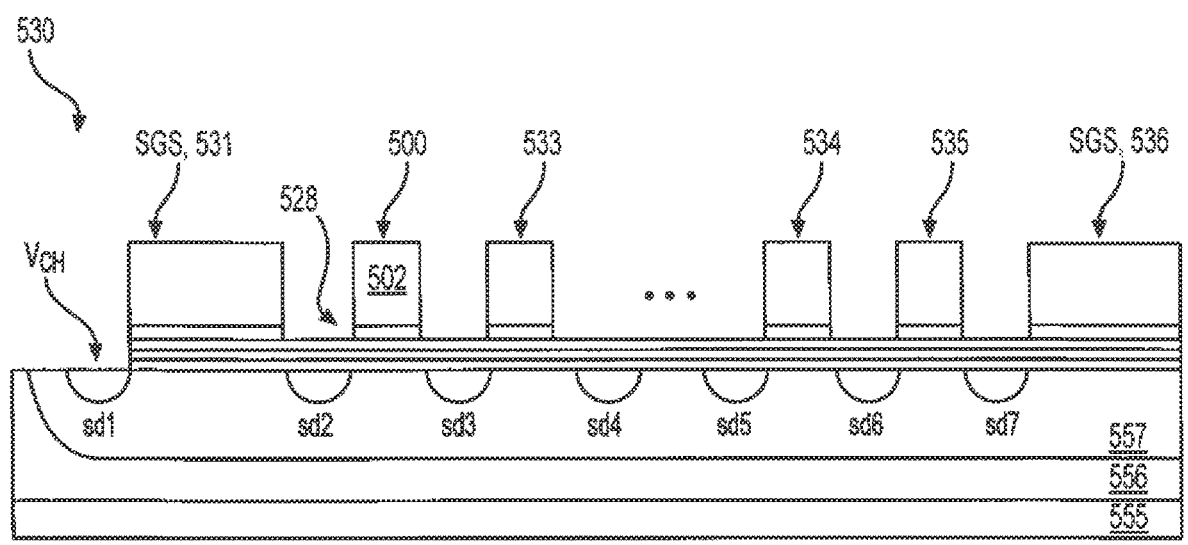
FIG. 5B illustrates a cross-sectional view of the structure of FIG. 5A along line 429.

As an alternative, as shown in FIGS. 5A and 5B, the flat or planar memory cell has been developed in which the control gate is flat or planar; that is, it does not wrap around the floating gate, and its only contact with the charge storage layer is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 5B illustrates a cross-sectional view of the structure of FIG. 5A along contact line connector 529. The NAND string 530 includes an SGS transistor 531, example memory cells 500, 533, . . . , 534 and 535, and an SGD transistor 536. The memory cell 400, as an example of each memory cell, includes the control gate 402, the IPD layer 428, the floating gate 404 and the tunnel oxide layer 505, consistent with FIG. 5A. Passageways in the IPD layer in the SGS and SGD transistors allow the control gate layers and floating gate layers to communicate. The control gate and floating gate layers may be polysilicon and the tunnel oxide layer may be silicon oxide, for instance. The IPD layer can be a stack of nitrides (N) and oxides (O) such as in a N—O—N—O—N configuration.

The NAND string may be formed on a substrate which comprises a p-type substrate region 555, an n-type well 556 and a p-type well 557. N-type source/drain diffusion regions sd1, sd2, sd3, sd4, sd5, sd6 and sd7 are formed in the p-type well. A channel voltage, Vch, may be applied directly to the channel region of the substrate.

Figure 6A:
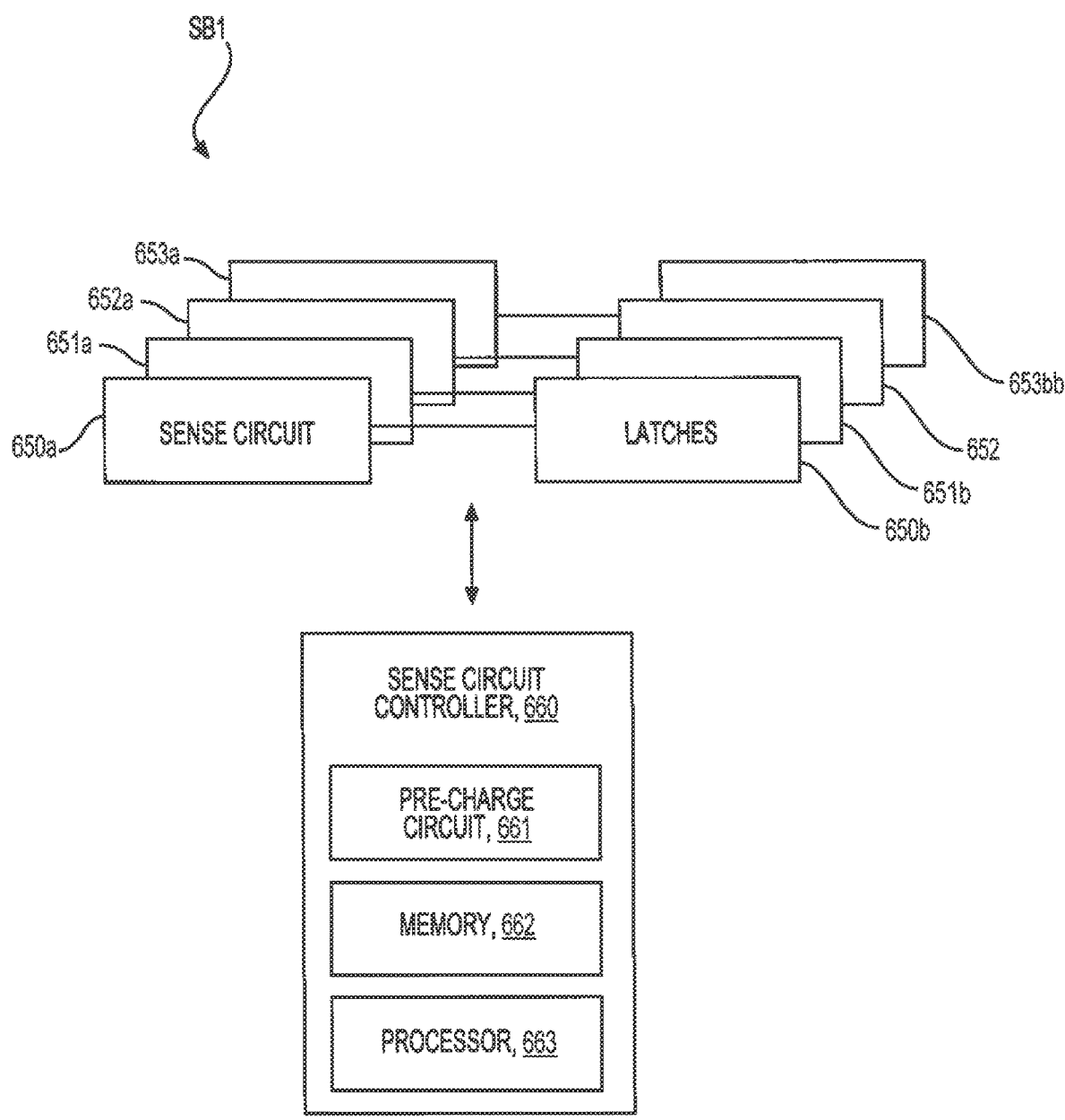
FIG. 6A illustrates an example block diagram of the sense block SB1 of FIG. 1.

FIG. 6A illustrates an example block diagram of the sense block SB1 of FIG. 1. In one approach, a sense block comprises multiple sense circuits. Each sense circuit is associated with data latches. For example, the example sense circuits 650a, 651a, 652a and 553a are associated with the data latches 650b, 551b, 652b and 653b, respectively. In one approach, different subsets of bit lines can be sensed using different respective sense blocks. This allows the processing load which is associated with the sense circuits to be divided up and handled by a respective processor in each sense block. For example, a sense circuit controller 660 in SB1 can communicate with the set of sense circuits and latches. The sense circuit controller may include a pre-charge circuit 661 which provides a voltage to each sense circuit for setting a pre-charge voltage. In one possible approach, the voltage is provided to each sense circuit independently, e.g., via the data bus 603 and a local bus such as LBUS1 or LBUS2 in FIG. 6B. In another possible approach, a common voltage is provided to each sense circuit concurrently, e.g., via the contact line 605 in FIG. 6B. The sense circuit controller may also include a memory 662 and a processor 663. The memory 662 may store code which is executable by the processor to perform the functions described herein. These functions can include reading latches which are associated with the sense circuits, setting bit values in the latches and providing voltages for setting pre-charge levels in sense nodes of the sense circuits. Further example details of the sense circuit controller and the sense circuits 650a and 651a are provided below.

The sense circuit controller can communicate with different sense circuits in a time-multiplexed manner, for instance. A contact line 605 may be connected to the voltage clamp in each sense circuit, in one approach.

The sense circuit 651a includes latches 651b, including a trip latch 646, an offset verify latch 647 and data state latches 648. A voltage clamp 641 may be used to set a pre-charge voltage at a sense node 642. A sense node to bit line (BL) switch 643 selectively allows the sense node to communicate with a bit line 645, and a voltage clamp 644 can set a voltage on the bit line. The bit line 645 is connected to one or more memory cells such as a memory cell MC2. A local bus, LBUS2, allows the sense circuit controller to communicate with components in the sense circuit, such as the latches 651b and the voltage clamp in some cases. To communicate with the sense circuit 651a, the sense circuit controller provides a voltage via a contact line 601 to a transistor 606 to connect LBUS2 with DBUS.

The sense circuit 650a may be a first sense circuit which comprises a first trip latch 626 and the sense circuit 651a may be a second sense circuit which comprises a second trip latch 646.

The sense circuit 650a is an example of a first sense circuit comprising a first sense node 622, where the first sense circuit is associated with a first memory cell MC1 and a first bit line 625. The sense circuit 651a is an example of a second sense circuit comprising a second sense node 642, where the second sense circuit is associated with a second memory cell MC2 and a second bit line 645.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6B:
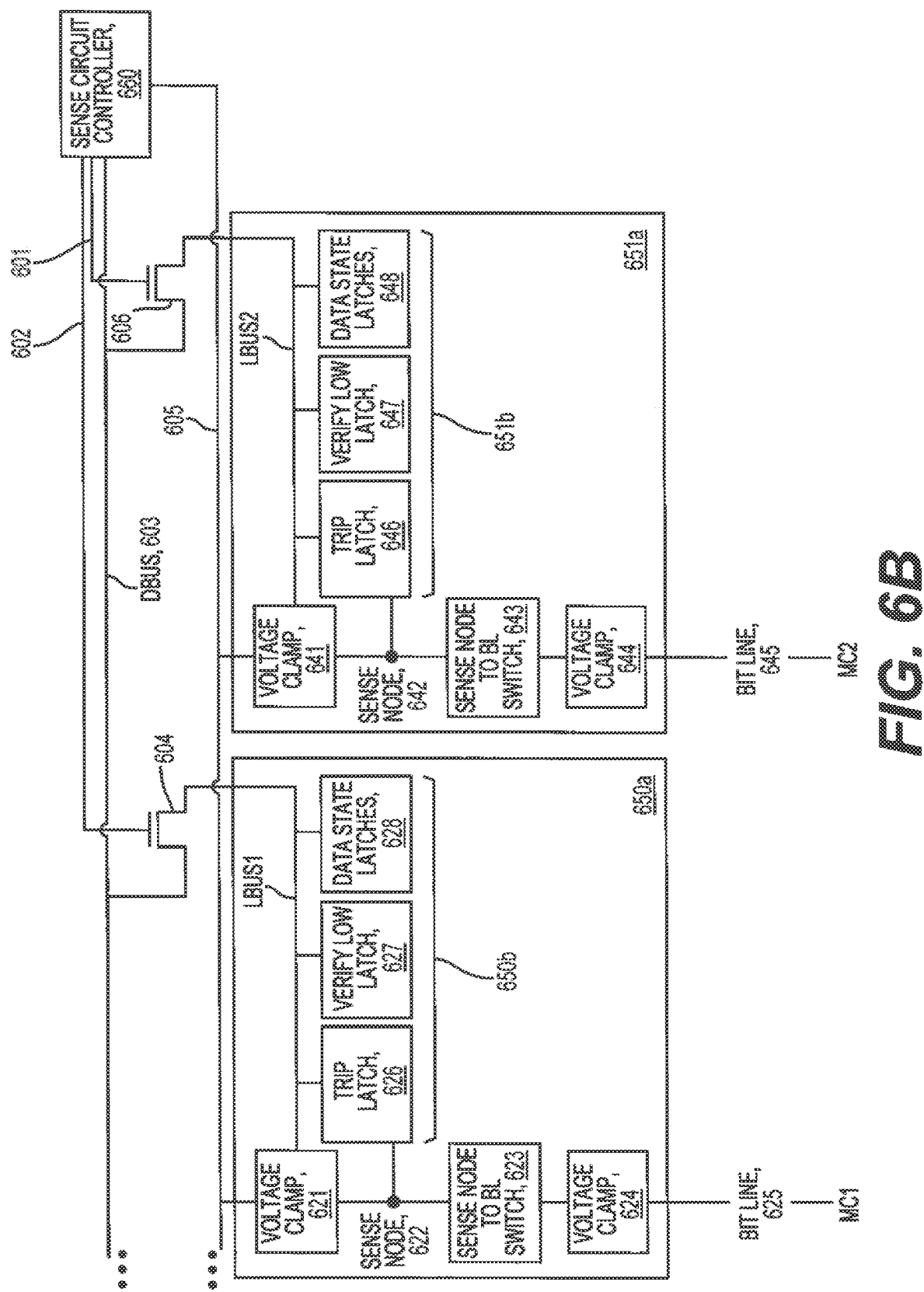
FIG. 6B illustrates another example block diagram of the sense block SB1 of FIG. 1.

FIG. 6B illustrates another example block diagram of the sense block SB1 of FIG. 1. The sense circuit controller 660 communicates with multiple sense circuits including example sense circuits 650a and 651a, also shown in FIG. 6A. The sense circuit 650a includes latches 650b, including a trip latch 626, an offset verify latch 627 and data state latches 628. The sense circuit further includes a voltage clamp 621 such as a transistor which sets a pre-charge voltage at a sense node 622. A sense node to bit line (BL) switch 623 selectively allows the sense node to communicate with a bit line 625, e.g., the sense node is electrically connected to the bit line so that the sense node voltage can decay. The bit line 625 is connected to one or more memory cells such as a memory cell MC1. A voltage clamp 624 can set a voltage on the bit line, such as during a sensing operation or during a program voltage. A local bus, LBUS1, allows the sense circuit controller to communicate with components in the sense circuit, such as the latches 650b and the voltage clamp in some cases. To communicate with the sense circuit 650a, the sense circuit controller provides a voltage via a contact line 602 to a transistor 604 to connect LBUS1 with a data bus DBUS 603. The communicating can include sending data to the sense circuit and/or receive data from the sense circuit.

Figure 7A:
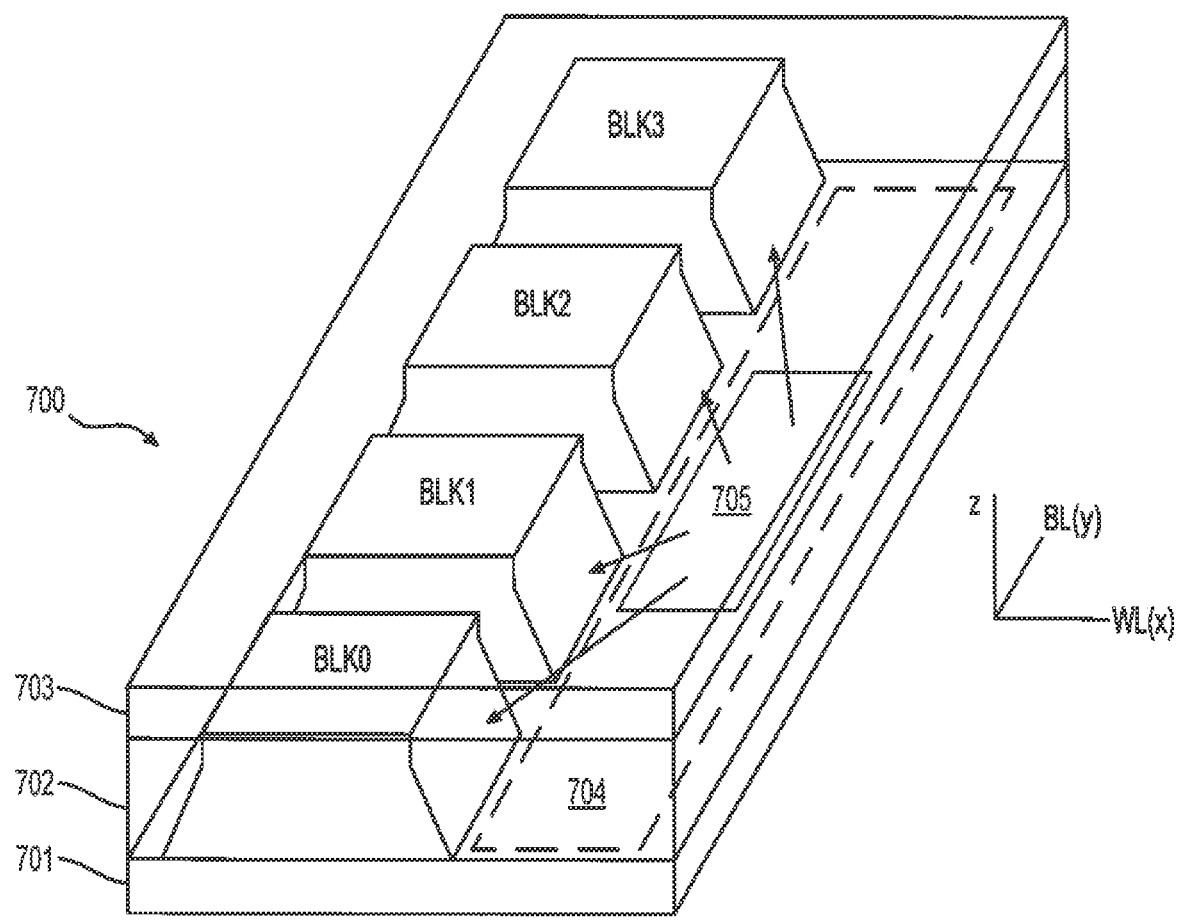
FIG. 7A illustrates a perspective view of a set of blocks in an example three-dimensional configuration of the memory array of FIG. 1.

FIG. 7A is a perspective view of a set of blocks 700 in an example three-dimensional configuration of the memory array 126 of FIG. 1. On the substrate are example blocks BLK0, BLK1, BLK2 and BLK3 of memory cells (storage elements) and a peripheral area 704 with circuitry for use by the blocks. For example, the circuitry can include voltage drivers 705 which can be connected to control gate layers of the blocks. In one approach, control gate layers at a common height in the blocks are commonly driven. The substrate 701 can also carry circuitry under the blocks, along with one or more lower metal layers which are patterned in conductive paths to carry signals of the circuitry. The blocks are formed in an intermediate region 702 of the memory device. In an upper region 703 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 7B:
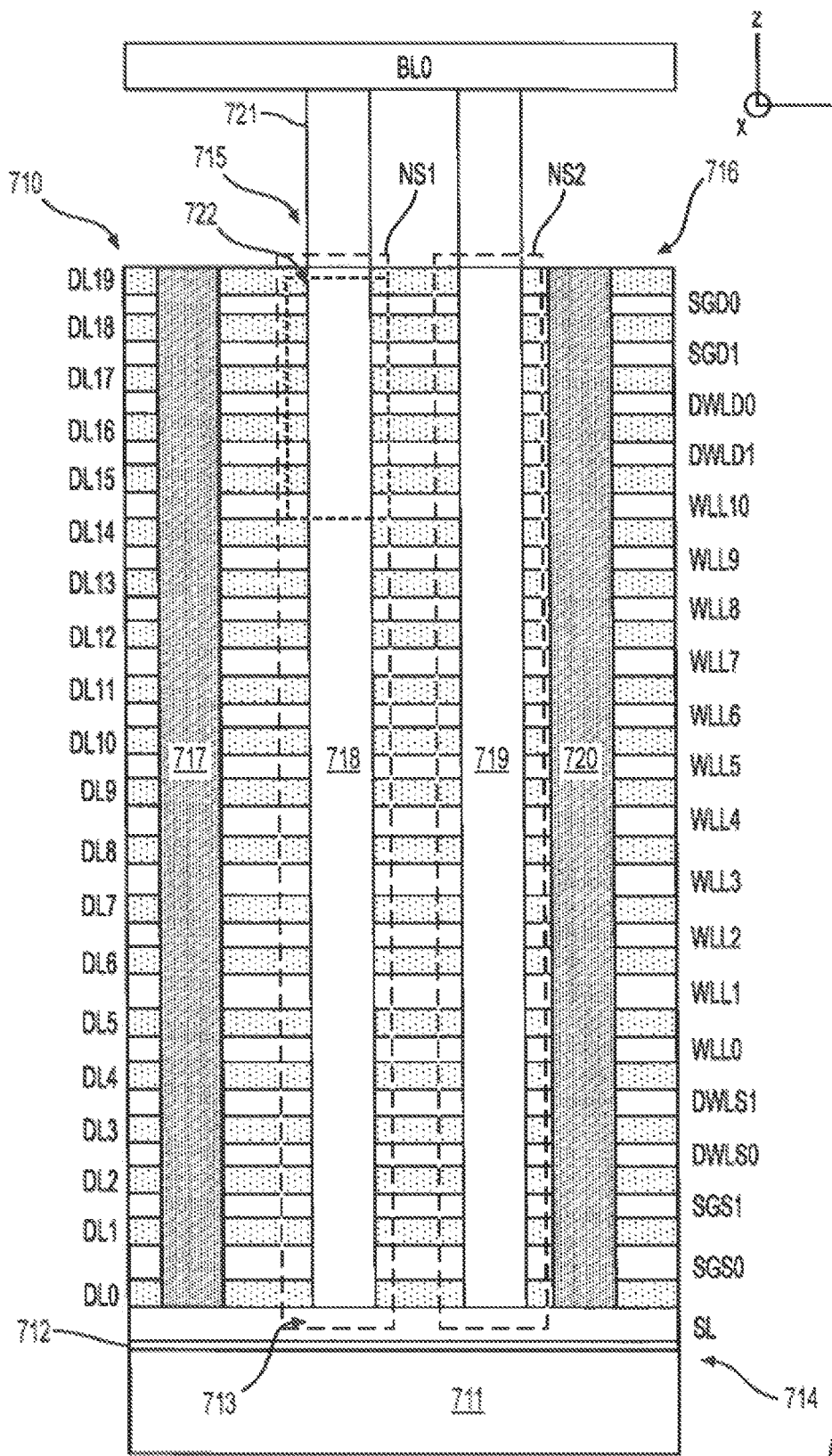
FIG. 7B illustrates an example cross-sectional view of a portion of one of the blocks of FIG. 7A.

FIG. 7B illustrates an example cross-sectional view of a portion of one of the blocks of FIG. 7A. The block comprises a stack 710 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack which comprise NAND strings NS1 and NS2 are illustrated. Each NAND string encompasses a memory hole 718 or 719 which is filled with materials which form memory cells adjacent to the word lines. A region 722 of the stack is shown in greater detail in FIG. 7D.

The stack includes a substrate 711, an insulating film 712 on the substrate, and a portion of a source line SL. NS1 has a source-end 713 at a bottom 714 of the stack and a drain-end 715 at a top 716 of the stack. Contact line connectors (e.g., slits, such as metal-filled slits) 717 and 720 may be provided periodically across the stack as interconnects which extend through the stack, such as to connect the source line to a particular contact line above the stack. The contact line connectors may be used during the formation of the word lines and subsequently filled with metal. A portion of a bit line BL0 is also illustrated. A conductive via 721 connects the drain-end 715 to BL0.

Figure 7C:
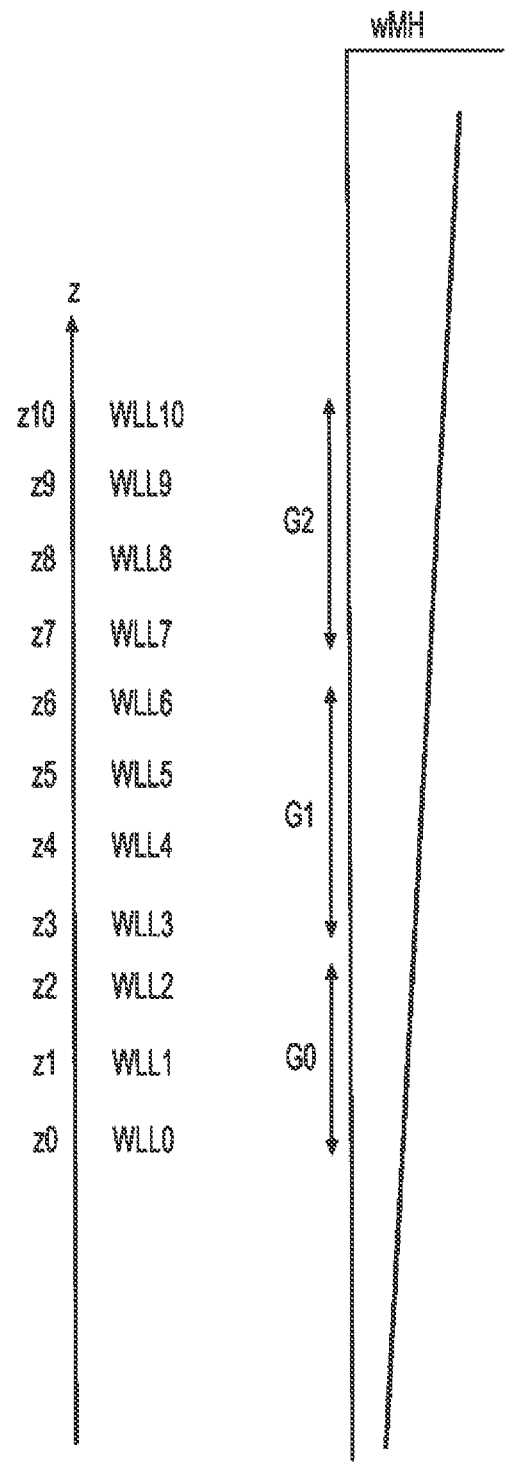
FIG. 7C illustrates a plot of memory hole diameter in the stack of FIG. 7B.

FIG. 7C illustrates a plot of memory hole diameter in the stack of FIG. 7B. The vertical axis is aligned with the stack of FIG. 7B and illustrates a width (wMH), e.g., diameter, of the memory holes 718 and 719. The word line layers WLL0-WLL10 of FIG. 7A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 7D:
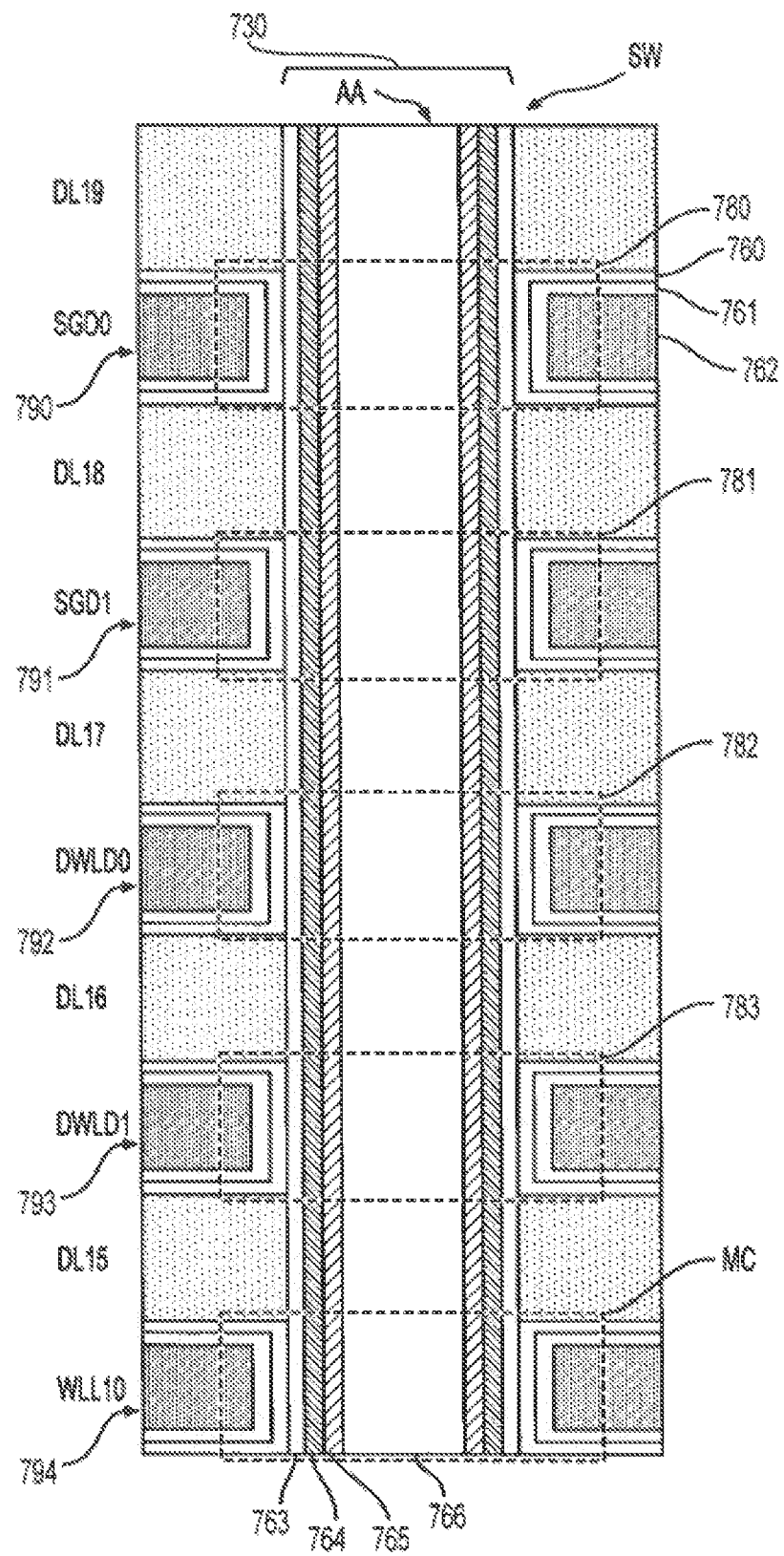
FIG. 7D illustrates a close-up view of the region 622 of the stack of FIG. 7B.

FIG. 7D illustrates a close-up view of the region 722 of the stack of FIG. 7B. Memory cells are formed at the different levels of the stack at the intersection of a word line layer and a memory hole. In this example, SGD transistors 780 and 781 are provided above dummy memory cells 782 and 783 and a data memory cell MC. A number of layers can be deposited along the sidewall (SW) of the memory hole 730 and/or within each word line layer, e.g., using atomic layer deposition. For example, each column (e.g., the pillar which is formed by the materials within a memory hole) can include a charge-trapping layer or film 763 such as SiN or other nitride, a tunneling layer 664, a polysilicon body or channel 765, and a dielectric core 766. A word line layer can include a blocking oxide/block high-k material 760, a metal barrier 761, and a conductive metal 762 such as Tungsten as a control gate. For example, control gates 790, 791, 792, 793 and 794 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 8A:
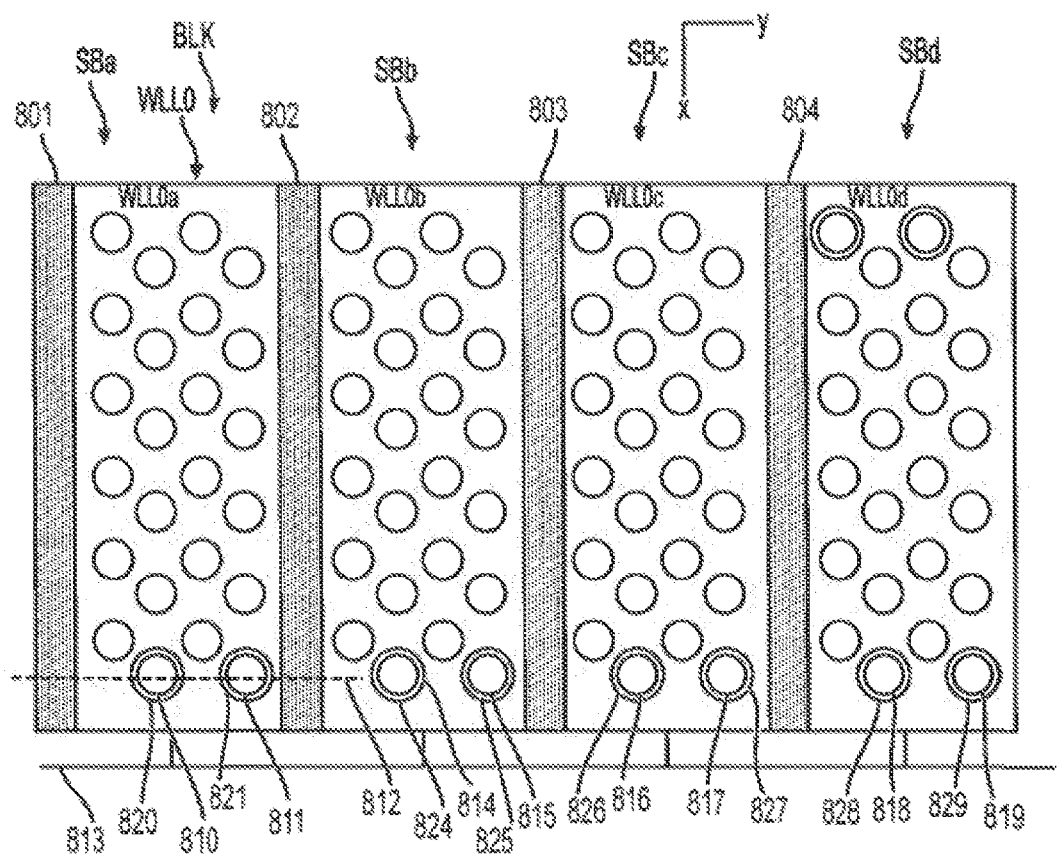
FIG. 8A illustrates a top view of an example word line layer WLL0 of the stack of FIG. 6B.

FIG. 8A illustrates a top view of an example word line layer WLL0 of the stack of FIG. 7B. As mentioned, a 3D memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a 3D memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

Figure 8B:
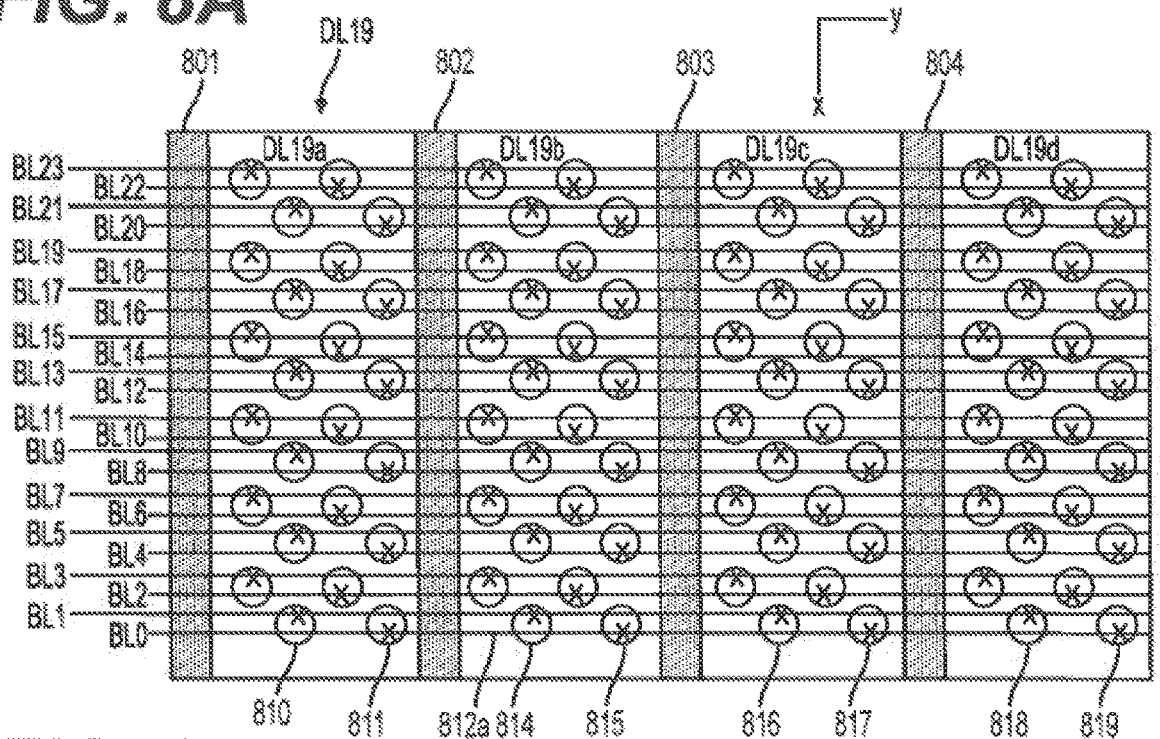
FIG. 8B illustrates a top view of an example top dielectric layer DL19 of the stack of FIG. 67B.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WLL0 a, WLL0 b, WLL0 c and WLL0d which are each connected by a contact line 813. The last region of a word line layer in a block can be connected to a first region of a word line layer in a next block, in one approach. The contact line 813, in turn, is connected to a voltage driver for the word line layer. The region WLL0a has example memory holes 810 and 811 along a contact line 812. The region WLL0b has example memory holes 814 and 815. The region WLL0 c has example memory holes 816 and 817. The region WLL0 d has example memory holes 818 and 819. The memory holes are also shown in FIG. 8B. Each memory hole can be part of a respective NAND string. For example, the memory holes 810, 814, 816 and 818 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 820 and 821 are in WLL0a, memory cells 824 and 825 are in WLL0b, memory cells 826 and 827 are in WLL0c, and memory cells 828 and 829 are in WLL0d. These memory cells are at a common height in the stack.

Contact line connectors (e.g., slits, such as metal-filled slits) 801, 802, 803 and 804 may be located between and adjacent to the edges of the regions WLL0 a-WLL0 d. The contact line connectors provide a conductive path from the bottom of the stack to the top of the stack. For example, a source line at the bottom of the stack may be connected to a conductive line above the stack, where the conductive line is connected to a voltage driver in a peripheral region of the memory device. See also FIG. 9A for further details of the sub-blocks SBa-SBd of FIG. 8A.

FIG. 8B illustrates a top view of an example top dielectric layer DL19 of the stack of FIG. 7B. The dielectric layer is divided into regions DL19 a, DL19 b, DL19 c and DL19d. Each region can be connected to a respective voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region DL19a has the example memory holes 810 and 811 along a contact line 812a which is coincident with a bit line BL0. A number of bit lines extend above the memory holes and are connected to the memory holes as indicated by the "X" symbols. BL0 is connected to a set of memory holes which includes the memory holes 811, 815, 817 and 819. Another example bit line BL1 is connected to a set of memory holes which includes the memory holes 810, 814, 816 and 818. The contact line connectors (e.g., slits, such as metal-filled slits) 801, 802, 803 and 804 from FIG. 8A are also illustrated, as they extend vertically through the stack. The bit lines can be numbered in a sequence BL0-BL23 across the DL19 layer in the −x direction.

Different subsets of bit lines are connected to memory cells in different rows. For example, BL0, BL4, BL8, BL12, BL16, and BL20 are connected to memory cells in a first row of cells at the right hand edge of each region. BL2, BL6, BL10, BL14, BL18, and BL22 are connected to memory cells in an adjacent row of cells, adjacent to the first row at the right hand edge. BL3, BL7, BL11, BL15, BL19, and BL23 are connected to memory cells in a first row of cells at the left hand edge of each region. BL1, BL5, BL9, BL13, BL17, and BL21 are connected to memory cells in an adjacent row of memory cells, adjacent to the first row at the left hand edge.

Figure 9A:
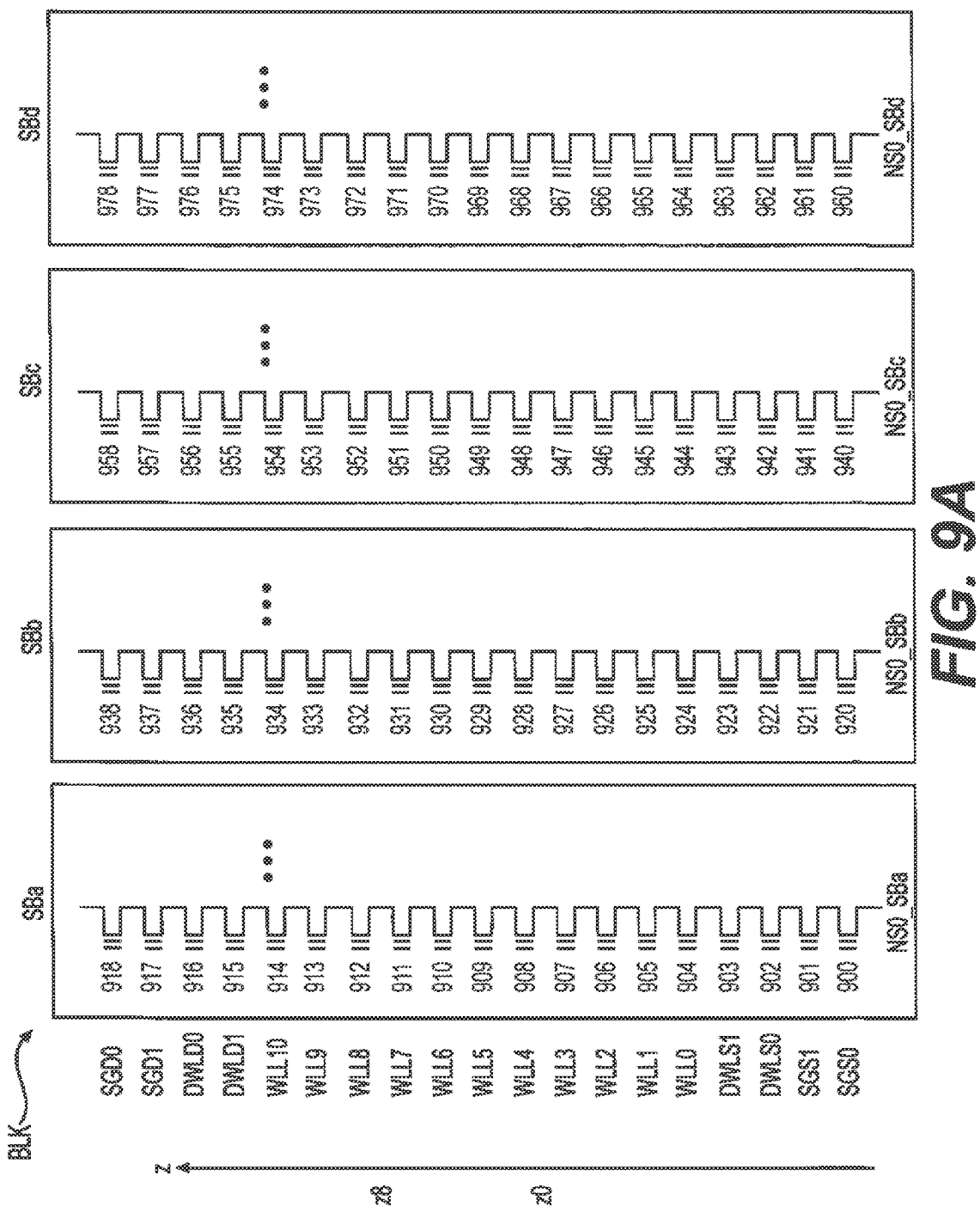
FIG. 9A illustrates example NAND strings in the sub-blocks SBa-SBd of FIG. 8A.

FIG. 9A illustrates example NAND strings in the sub-blocks SBa-SBe of FIG. 8A. The sub-blocks are consistent with the structure of FIG. 7B. The conductive layers in the stack are illustrated for reference at the left hand side. Each sub-block includes multiple NAND strings, where one example NAND string is illustrated. For example, SBa comprises an example NAND string NS0, SBb comprises an example NAND string NS1, SBc comprises an example NAND string NS2, SBd comprises an example NAND string NS3, and SBe comprises an example NAND string NS4.

Additionally, NS0_SBa include SGS transistors 900 and 901, dummy memory cells 902 and 903, data memory cells 904, 905, 906, 907, 908, 909, 910, 911, 912, 913 and 914, dummy memory cells 915 and 916, and SGD transistors 917 and 918.

NS1_SBb include SGS transistors 920 and 921, dummy memory cells 922 and 923, data memory cells 924, 925, 926, 927, 928, 929, 930, 931, 932, 933 and 934, dummy memory cells 935 and 936, and SGD transistors 937 and 938.

NS2_SBc include SGS transistors 940 and 941, dummy memory cells 942 and 843, data memory cells 944, 945, 946, 947, 948, 949, 950, 951, 952, 953 and 954, dummy memory cells 955 and 956, and SGD transistors 957 and 958.

NS3_SBd include SGS transistors 960 and 961, dummy memory cells 962 and 963, data memory cells 964, 965, 966, 967, 968, 969, 970, 971, 972, 973 and 974, dummy memory cells 975 and 976, and SGD transistors 977 and 978.

NS4_SBe include SGS transistors 980 and 981, dummy memory cells 982 and 983, data memory cells 984, 985, 986, 987, 988, 989, 980, 981, 982, 983 and 984, dummy memory cells 985 and 986, and SGD transistors 987 and 988.

At a given height in the block, memory cells in each sub-block are at a common height. For example, one set of memory cells (including the memory cell 904) is among a plurality of memory cells formed along tapered memory holes in a stack of alternating conductive and dielectric layers. The one set of memory cells is at a particular height z0 in the stack. Another set of memory cells (including the memory cell 924) connected to the one word line (WLL0) are also at the particular height. In another approach, another set of memory cells (e.g., including the memory cell 912) connected to another word line (e.g., WLL8) are at another height (z8) in the stack.

FIG. 9B illustrates another example view of NAND strings in sub-blocks. The NAND strings include NS0_SBa, NS1_SBb, NS2_SBc, NS3_SBd, and NS4_SBe which have 48 word lines (e.g., WL0-WL47). Each sub-block comprises NAND string groups which extend in the x direction and which have a common SGD line, e.g., SGD0, SGD1, SGD2, SGD3, or SGD4. In this simplified example, there is only one SGD transistor and one SGS transistor in each NAND string. The NAND strings NS0_SBa, NS1_SBb, NS2_SBc, NS3_SBd, and NS4_SBe are in sub-blocks SBa, SBb, SBc, SBd, and SBe, respectively. Further, example, groups of word lines G0, G1 and G2 are illustrated.

Figure 10:
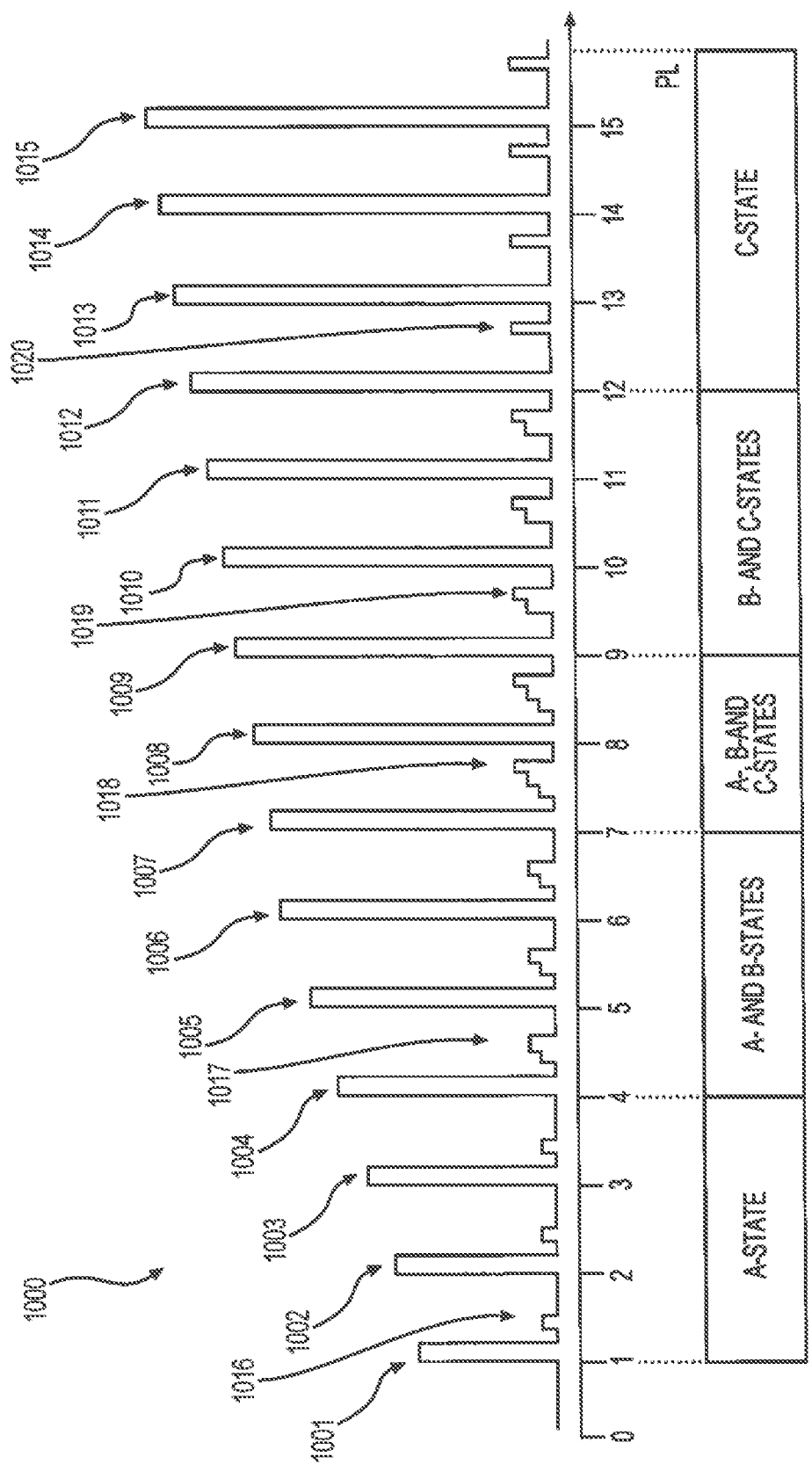
FIG. 10 illustrates the Vth distributions of memory cells in an example programming operation with at least four data states.

FIG. 10 illustrates a waveform of an example programming operation. The horizontal axis illustrates program loop numbers and the vertical axis illustrates program voltage values and program verify values. A program voltage (Vpgm) may include a word line voltage (WLVpgm) and/or a bit line voltage (BLVpgm). Generally, a programming operation may involve applying a pulse train to a selected word line, where the pulse train includes multiple program-verify (PV) iterations. The program portion of a PV iteration comprises the program voltage and the verify portion of the PV iteration comprises one or more verify voltages.

For each program voltage, a square waveform is illustrated for simplicity, although other shapes are possible such as a multilevel shape or a ramped shape. Further, Incremental Step Pulse Programming (ISPP) is used in this example, in which the program voltage steps up in each successive program loop. This example uses ISPP in a single programming step in which the programming is completed. ISPP can also be used in each programming step of a multistep operation.

A pulse train typically includes program voltages which increase stepwise in amplitude in each program-verify iteration using a voltage bias (dVpgm). The voltage bias may, for example, be a word line voltage bias. A new pulse train may be applied in each programming step of a multistep program-verify operation, starting at an initial program voltage (e.g., an initial Vpgm) and ending at a final program voltage (e.g., a final Vpgm) which does not exceed a threshold voltage Vth (e.g., a maximum allowed value). The initial program voltages can be the same or different in different programming steps. The final program voltages can also be the same or different in different programming steps. The voltage biases may be the same or different in the different programming steps. In some cases, a smaller voltage bias is used in a final programming step to reduce Vth distribution widths.

The pulse train 1000 includes a series of program voltages 1001, 1002, 1003, 1004, 1005, 1006, 1007, 1008, 1009, 1010, 1011, 1012, 1013, 1014, and 1015 that are applied to a word line selected for programming, and an associated set of non-volatile memory cells. In the example shown, one, two, or three verify voltages are provided after each program voltage, for example, based on a number of target data states which are being verified. The number of target data states being verified may, for example, correspond to a number of memory cells associated with the word line. A program voltage and corresponding verify voltage can be separated by applying 0 V to the selected word line between the program voltage and the verify voltage.

In the example shown, an A-state verify voltage of VvA (e.g., waveform or programming signal 1016) may be applied after each of the first, second, and third program voltages 1001, 1002, and 1003, respectively. A- and B-state verify voltages of VvA and VvB (e.g., programming signal 1017) may be applied after each of the fourth, fifth and sixth program voltages 1004, 1005 and 1006, respectively. A-, B- and C-state verify voltages of VvA, VvB, and VvC (e.g., programming signal 1018) may be applied after each of the seventh and eighth program voltages 1007 and 1008, respectively. B- and C-state verify voltages of VvB and VvC (e.g., programming signal 1019) may be applied after each of the ninth, tenth and eleventh program voltages 1009, 1010, and 1011, respectively. Finally, a C-state verify voltage of VvC (e.g., programming signal 1020) may be applied after each of the twelfth, thirteenth, fourteenth and fifteenth program voltages 1012, 1013, 1014, and 1015, respectively.

In some embodiments, the memory device 100 (e.g., using the state machine 112 of the control circuitry 110, the controller 122, and/or the control circuit 150) may use different program voltages and/or different program voltage biases to perform the verify operation. In some embodiments, a program voltage and a program voltage bias used to perform the programming operation may include a word line voltage and a word line voltage bias, respectively. Additionally, or alternatively, the program voltage and the program voltage bias used to perform the programming operation may include a bit line voltage and a bit line voltage bias, respectively.

FIGS. 11A-11G illustrate an example memory device for verifying whether memory cells have been programmed by selectively switching between different types of verification techniques. For example, FIGS. 11A-11G illustrate one or more example embodiments 1100 of a non-volatile memory device 1102 that includes a control circuitry 1104 and a memory cell array 1106. The memory cell array 1106 may include a set of memory cells connected via word lines and bit lines. The control circuitry 1104 may include a state machine capable of communicating with memory cells in the memory cell array 1106. The memory cells of the selected word line (shown as $WL_n$) may include memory cell (MC) A, MC B, MC C, and MC D. The selected word line may be connected to a set of bit lines, which include bit line (BL) 0, BL 1, BL 2, and BL 3. The control circuitry 1104 may verify memory cells using different verification techniques for different iterations of a verify operation, as will be described further herein.

Figure 11A:
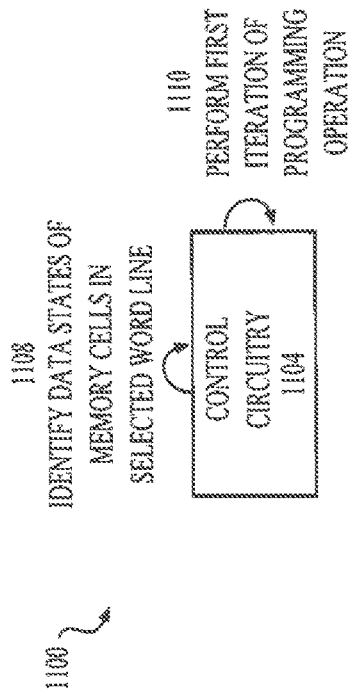
Figure 11A:
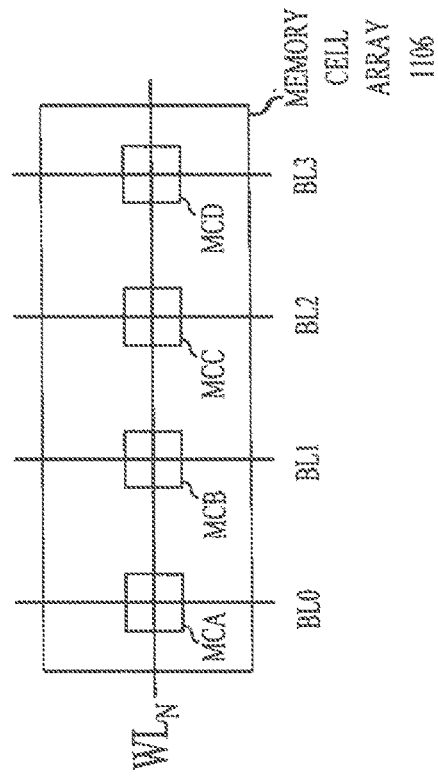

As shown in FIG. 11A by reference number 1108, the control circuitry 1104 may identify a set of data states for the set of memory cells of the selected word line. In some embodiments, the control circuitry 1104 may receive program command data (e.g., from a controller associated with the non-volatile memory device) and the program command data may specify memory cells and/or data states that each respective memory cell is to be programmed into. Additionally, or alternatively, the control circuitry may identify the data states by performing one or more read operations (sometimes referred to as sense operations). For example, the control circuitry may perform a read operation that includes providing a signal to a data latch of a memory cell. The signal may cause the data latch to provide the control circuitry with a return signal capable of identifying the data state. The control circuitry may perform a read operation for each respective memory cell connected to the selected word line.

As shown by reference number 1110, the control circuitry 1104 may perform a programming operation to begin to program the memory cells of the selected word line. A description of the programming operation is provided elsewhere herein.

Figure 11B:
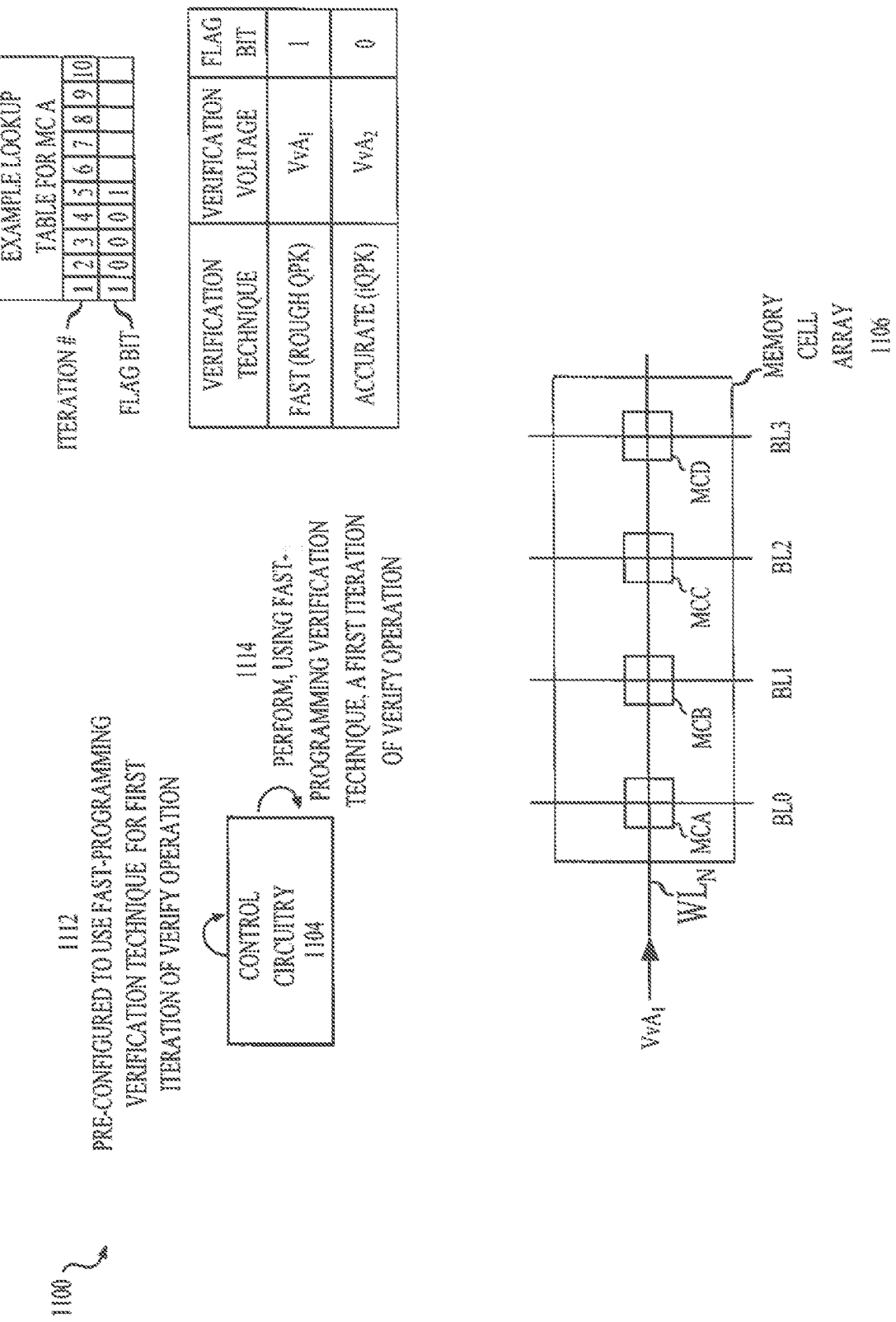

As shown in FIG. 11B by reference number 1112, the control circuitry 1104 may be pre-configured to utilize a fast-programming verification technique for a first iteration of a verify operation. For example, the control circuitry 1104 may be pre-configured such that when an initialization procedure is performed (e.g., a boot-up procedure), the control circuitry 1104 may be initialized to utilize a fast-programming verification technique. In some embodiments, the initialization procedure may also initialize one or more internal data states and/or related parameters.

The set of verification techniques may, for example, include one or more fast-programming verification techniques and one or more precision-based verification techniques. The one or more fast-programming verification techniques may include a rough quick pass write (QPW) technique, a floating QPW (FQPW) technique, a smart QPW (SQPW) technique, and/or the like. The one or more precision-based verification techniques may include an iQPW verification technique and/or a similar type of accurate programming technique. The fast-programming verification technique may be less accurate than the precision-based verification technique, but may have a faster execution-time, whereas the precision-based verification technique may be more accurate, but may have a slower execution-time.

In some embodiments, the control circuitry 1104 may be configured to utilize the fast-programming verification technique based on the iteration of the verify operation being a first iteration. For example, for each data state being verified, the control circuitry 1104 may be configured to utilize different verification techniques for different iterations of the verify operation. As a specific example, the control circuitry 1104 may be configured to utilize the fast-programming verification technique for a first iteration and for a last iteration of the verify operation for each memory cell. In this example, the control circuitry 1104 may be configured to utilize the precision-based programming technique for iterations that occur between the first iteration and the last iteration. In some embodiments, such as when memory cells are quad level cells (QLCs), the control circuitry 1104 may be configured to utilize the fast-programming verification technique for the first and second iterations and for the penultimate and final iterations of the verify operation. By utilizing the fast-programming verification technique for outer-most iterations (e.g., a first and last iteration), the control circuitry 1104 utilizes a verification technique when a threshold voltage distribution (Vth) of a memory cell has a position in a natural threshold voltage distribution (NVD) that corresponds with an upper and lower tail of the NVD.

In some embodiments, the control circuitry 1104 may utilize the fast-programming verification technique by referencing a data structure (e.g., a lookup table) associated with memory cells of the selected word line. For example, to utilize a verification technique to verify data state A, the control circuitry 1104 may reference a lookup table value associated with memory cell A. The lookup table may include a set of lookup table values that are used to associate a specific iteration of the verify operation with a specific verification technique (e.g., the fast-programming verification technique, the precision-based verification technique, etc.). For example, the lookup table may include a first lookup table value (e.g., a bit value of one) corresponding to the fast-programming verification technique and a second lookup table value (e.g., a bit value of zero) corresponding to the precision-based verification technique. In some embodiments, the lookup table may correspond to the set of memory cells. In some embodiments, multiple lookup tables may be implemented and may correspond to the set of memory cells.

As an example, the control circuitry 1104 may reference a first field of the lookup table. The first field, which corresponds to the first iteration of the verify operation, may store a lookup table value of one, where the lookup table value corresponds to the fast-programming verification technique. Thus, because the first field in the lookup table has the lookup table value of one, the control circuitry 1104 is able to use the fast-programing verification technique to verify whether memory cell A has been programmed to data state A.

In some embodiments, the control circuitry 1104 may utilize the fast-programming verification technique based on referencing a flag register. For example, if the memory cells are TLCs and the lookup table is a flag register, there may be a flag bit reserved for each data state (e.g., there may be seven flag bits corresponding to seven data states). Because certain data states do not begin verification until certain configured programming iterations are performed, the flag bits may be incremented from values of zero to values of one based on certain configured iterations of programming being performed. As a specific example, a flag register may have the following values: [0 0 0 0 0 0 0]. After the first iteration is performed, the flag register may be incremented to have the following values: [1 0 0 0 0 0 0]. This signals to perform the fast-programming verification technique after the first iteration of programming. If, for example, the verification of data state B is configured to begin during a fourth iteration, then the flag register after the fourth iteration of programming may be updated to have the following values: [1 1 0 0 0 0 0]. In this way, the flag register allows the control circuitry 1104 to determine when to begin performing the fast-programming verification technique.

Utilizing a verification technique may refer to being configured with, selecting, or identifying one or more verify voltage values corresponding to that verification technique. For example, the fast-programming verification technique and the precision-based verification technique may involve verifying memory cells using different verify voltages, different bit line voltage biases, different sense times, and/or the like. The fast-programming verification technique may include a first set of bit line voltage biases or a first set of sense times. The precision-based verification technique may include a second set of bit line voltage biases or a second set of sense times. Voltage biases or sense times may be used to control (e.g., speed up, slow down, etc.) a set of verify voltages that are provided to the memory cells via the selected word line. In some embodiments, such as when a verification technique involves slowing a speed at which a memory cell is programmed, the verification technique may include one or more program voltages (e.g., Vpgm), one or more program voltage biases (e.g., dVpgm), and/or the like. Additional information regarding performing verification techniques is provided elsewhere herein (e.g., in connection with FIG. 13, etc.).

In some embodiments, the control circuitry 1104 may be configured with (or have access to) voltage bias values or sense time (charge time) values for respective verification techniques. In some embodiments, a data structure accessible to the control circuitry 1104 may associate the voltage bias values or the sense time values with an iteration counter that identifies a current iteration of the verify operation, an iteration stop counter that identifies a final iteration of the verify operation (or a predicted final iteration), a memory cell identifier for a memory cell that is to be verified, a data state identifier for a data state that the memory cell is being programmed into, and/or the like. Additionally, or alternatively, the voltage bias values or the sense time values may be stored using a separate data structure or data storage device.

In some embodiments, the control circuitry 1104 may be configured with instructions specifying an initial verify voltage. Consequently, the control circuitry 1104 may not have to reference the data structure to identify an appropriate voltage bias or sense time to apply until a second iteration of the verify operation. In this way, the control circuitry 1104 conserves resources (e.g., processing resources, power resources, etc.) relative to having to reference the data structure to identify the initial verify voltage.

As shown by reference number 1114, the control circuitry 1104 may use the fast-programming verify technique to perform the first iteration of the verify operation. For example, the control circuitry 1104 may apply a first bit line voltage bias to a bit line connecting to memory cell A (e.g., BL 0), may apply an initial verify voltage to the selected word line, and/or may verify whether memory cell A has a threshold voltage Vth above the initial verify voltage. By applying the first bit line voltage bias to memory cell A, the control circuitry 1104 causes a change in a voltage (e.g., a control gate voltage (VCG), a verify voltage, etc.) received at a control gate of memory cell A.

In some embodiments, the control circuitry 1104 may selectively inhibit certain memory cells from receiving verify voltages. For example, certain memory cells may be unlikely to have completed programming after one iteration. Consequently, the control circuitry 1104 may be configured to inhibit these memory cells from receiving verify pulses until subsequent iterations of the verify operation. In this way, resources (e.g., processing resources, power resources, etc.) are conserved that would otherwise be wasted attempting to verify memory cells have yet to be completely programmed.

In some embodiments, the control circuitry 1104 may be configured to be configured to utilize the fast-programming verification technique during a first and last iteration during which a data state of each respective memory cell is verified. In some embodiments, the control circuitry 1104 may be configured to be configured to utilize the fast-programming verification technique based on a Vth having a position in the NVD that corresponds to the lower tail or to the upper tail. In some embodiments, the control circuitry 1104 may be configured to be configured to utilize the precision-based verification technique during a second iteration through a penultimate iteration of the verify operation.

In some embodiments, a total number of verify operations to perform on each data state may be predetermined or predicted. In this case, the control circuitry 1104 may reference an iteration counter such that the control circuitry 1104 is able to perform actions based on a particular iteration of the verify operation that is being performed. In some embodiments, the control circuitry 1104 may update an iteration counter based on performing the programming operation (or the verify operation). For example, the control circuitry 1104 may reference a data structure and may increment the iteration counter to keep track of a current iteration of the verify operation. The data structure may be part of the flag register or may be supported by another device or component.

In the example shown, the control circuitry 1104 may update the iteration counter from a value of zero to a value of one. By updating the iteration counter, the control circuitry 1104 may use the value stored by the iteration counter to identify which field in respective flag registers to read in order to identify appropriate verify voltage values for the verify operation. For example, if the iteration counter has a value of one, the control circuitry 1104 may be configured to perform a read operation to read the first field of one or more flag registers.

As described, the iteration counter may keep track of a value that represents a total number of iterations of the verify operation that have been performed. Additionally, or alternatively, the iteration counter may keep track of a value that represents a number of times a particular data state of a memory cell has attempted to be verified. In some embodiments, the control circuitry 1104 may determine a position of the lower tail of the NVD based on detection results.

In this way, the control circuitry 1104 performs the first iteration of the verify operation using the fast-programming verification technique.

Figure 11C:
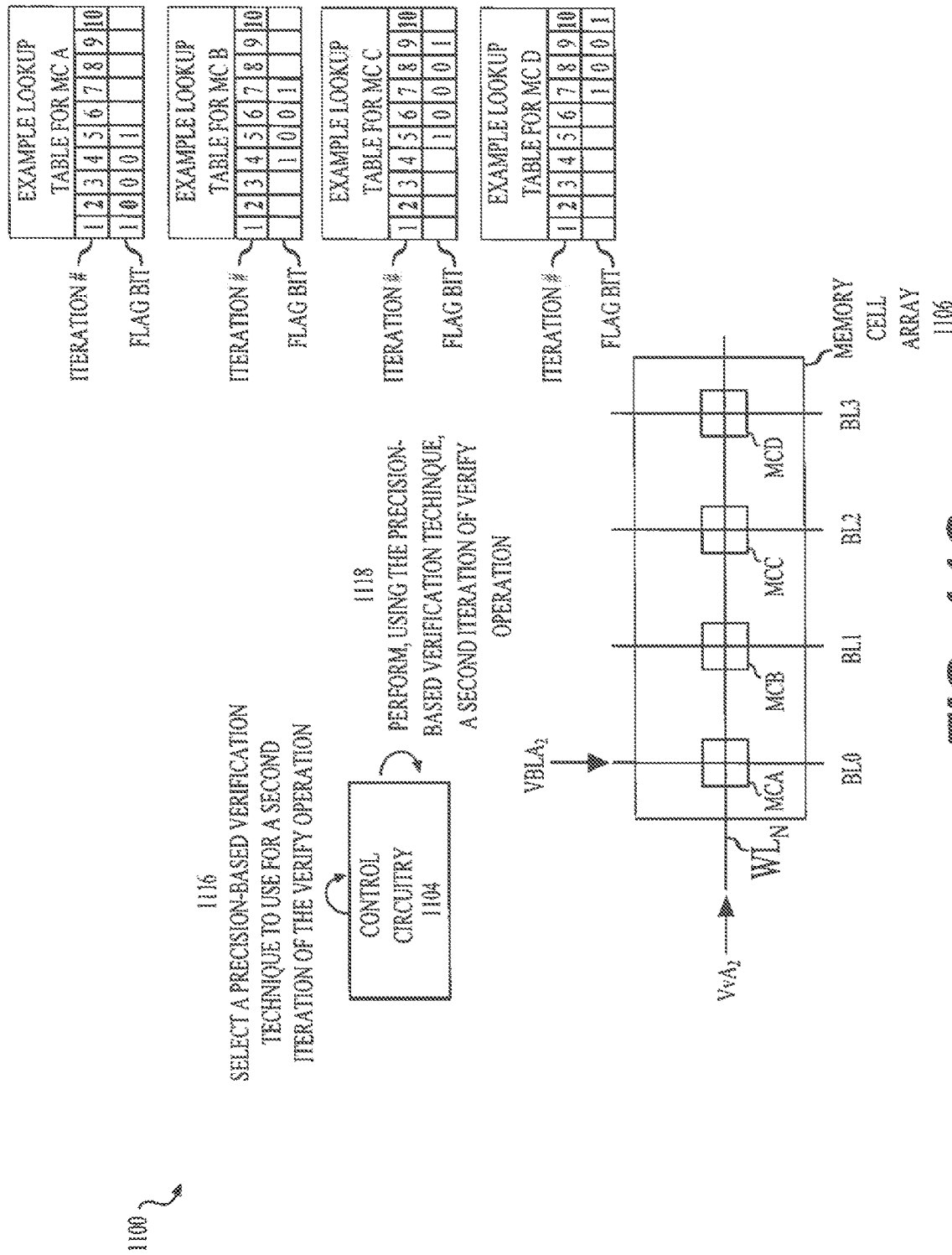

As shown in FIG. 11C by reference number 1116, the control circuitry 1104 may be configured to utilize the precision-based verification technique for a second iteration of the verify operation. For example, the control circuitry 1104 may be configured to utilize the precision-based verification technique by referencing a lookup table or flag register to verify that a current iteration is not a first iteration of the verify operation, and by verifying, during the current iteration, that a Vth of a memory does not have a position in an NVD that corresponds to a lower tail of the NVD (as described further herein). The precision-based verification technique may utilize a second set of verify voltages, a second set of bit line voltage biases, a second set of sense times, and/or the like.

In some embodiments, the control circuitry 1104 may determine to utilize the precision-based verification technique based on referencing the data structure (e.g., the lookup table) associated with the memory cells. For example, to utilize a verification technique to verify whether memory cell A has been programmed to data state A, the control circuitry 1104 may reference a second field of the lookup table. The second field, which corresponds to the second iteration of the verify operation, may store a lookup table value of zero, where the lookup table value corresponds to the precision-based verification technique. Thus, because the second field in the lookup table has the lookup table value of zero, the control circuitry 1104 is able to use the precision-based verification technique to verify whether memory cell A has been programmed to data state A.

In some embodiments, the control circuitry 1104 may determine whether a current iteration of the verify operation is the first iteration. For example, the control circuitry 1104 may reference a flag register that has flag bit values corresponding to the data states and may determine that the current iteration is not the first iteration based on one or more of the flag bit values having values of one (e.g., a value of zero may indicate that a current iteration is a first iteration and may be incremented to a value of one after the first iteration has been completed). This may allow the control circuitry 1104 to confirm that the current iteration is not the first iteration of the verify technique. As will be shown by one or more techniques below, the control circuitry 1104 may then perform a second verification to verify whether the current iteration is a final iteration of the verify operation, and may perform the precision-based verification technique if the current iteration is not the final iteration.

In some embodiments, the control circuitry 1104 may determine whether the current iteration of the verify operation is likely to be a final iteration. For example, the control circuitry 1104 may reference an iteration counter that increments after each successive iteration of the verify operation has been completed. In this case, the control circuitry 1104 may be configured with a value identifying a total number of iterations and may compare the iteration counter value with the value identifying the final iteration (or identifying the total number of iterations) to determine whether the current iteration is the final iteration. If the current iteration is the final iteration, the control circuitry 1104 may perform the fast-programming verification technique. If the current iteration is not the final iteration, the control circuitry 1104 may perform the precision-based verification technique.

In the example shown, the iteration counter may have a value identifying that the current iteration is the second iteration. The control circuitry 1104 may compare the iteration counter to a configured value identifying the final iteration determine that the current iteration is not the final iteration, and, as described further herein, may perform the precision-based verification technique based on the determination.

In some embodiments, the control circuitry 1104 may determine, for respective data states, which memory cells have yet to complete programming. For example, the control circuitry 1104 may determine, for each data state, specific memory cells that have yet to complete the program-verify operation. In this case, the control circuitry 1104 (e.g., by using or referencing a counting circuit) may perform a detection operation that counters a number of memory cells that have yet to complete programming.

If the number of memory cells that remain to be programmed fails to satisfy a threshold criteria, the control circuitry 1104 may perform the fast-programming verification technique. For example, if threshold criteria is that at least two memory cells remain to be programmed, and only one memory has yet to be programmed, the number of memory cells fails to satisfy the threshold criteria and the control circuit 1104 may perform the fast-programming verification technique. If the number of memory cells that remain to be programmed satisfy the threshold criteria, the control circuitry 1104 may perform the precision-based verification technique. For example, if the threshold criteria is that at least two memory cells remain to be programmed, and five memory cells remain to be programmed, the number of memory cells satisfies the threshold criteria and the control circuit 1104 may perform the precision-based verification technique.

In the example shown, the control circuitry 1104 may compare the number of memory cells that remain to be programmed against the total number of memory cells for each data state. In this case, the control circuitry 1104 may determine to perform the precision-based verification technique based on the number of memory cells that have yet to complete programming satisfying a threshold criteria, such as a criteria that at least two memory cells remain to be programmed.

In some embodiments, the control circuitry 1104 may determine, for respective data states, which memory cells have completed programming. For example, rather than determine which memory cells have yet to complete programming, the control circuitry 1104 may determine which memory cells have completed programming.

As shown by reference number 1118, the control circuitry 1104 may perform the second iteration of the verify operation. For example, the control circuitry 1104 may perform the second iteration of the verify operation by applying a first bit line voltage bias, of the second set of bit line voltage biases, to a bit line connecting with memory cell A, by applying a second verify voltage, of the set of verify voltages, to the selected word line, and/or by verifying whether memory cell A has a threshold voltage above the second verify voltage.

In some embodiments, the control circuitry 1104 may update the iteration counter based on performing the second iteration of the verify operation. For example, the control circuitry 1104 may increment the iteration counter to keep track of a current iteration of the verify operation. In the example shown, the control circuitry 1104 may update the iteration counter from a value of one to a value of two.

In this way, the control circuitry 1104 uses the precision-based verification technique to perform the second iteration of the verify operation.

Figure 11D:
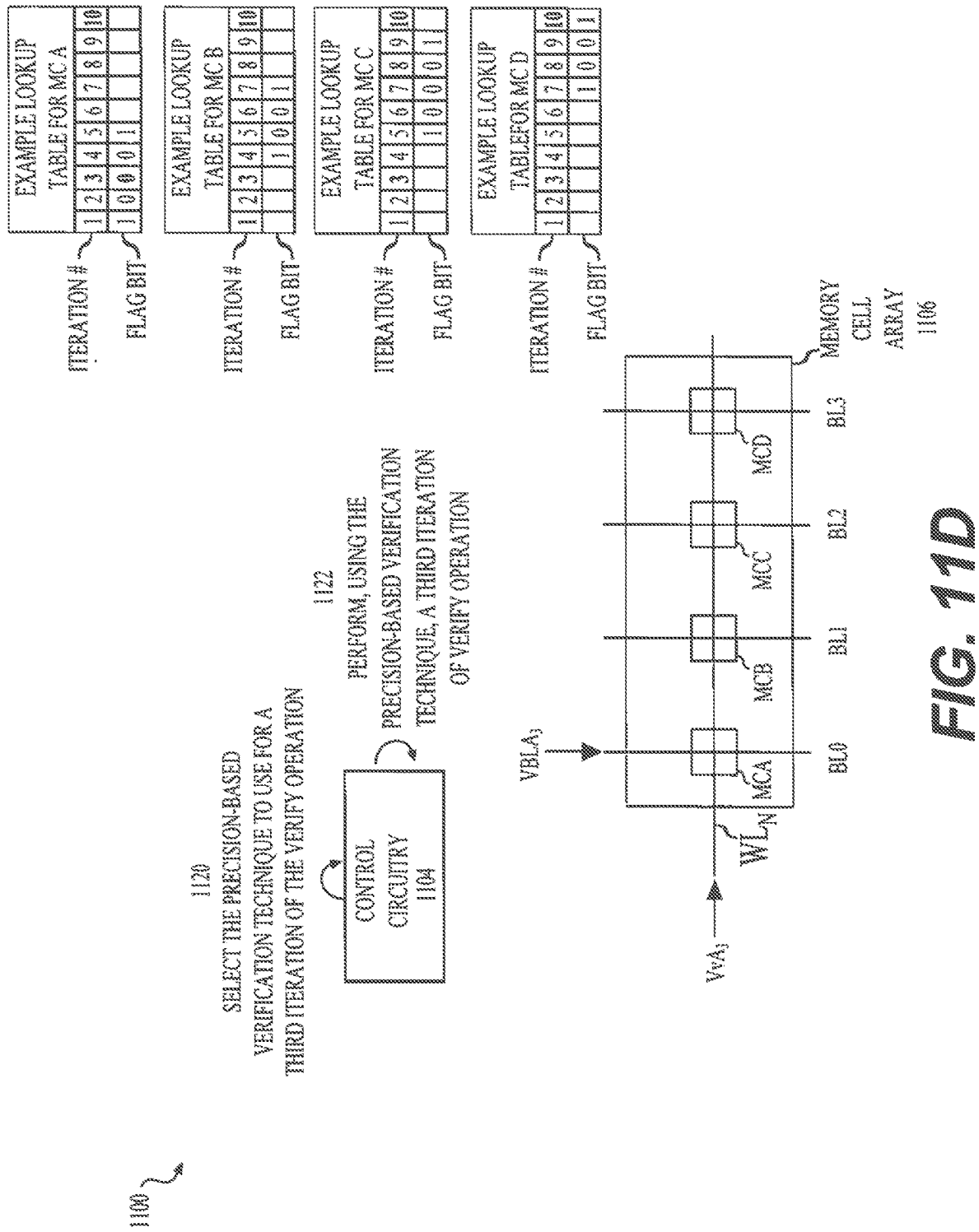

As shown in FIG. 11D by reference number 1120, the control circuitry 1104 may be configured to utilize the precision-based verification technique for a third iteration of the verify operation. For example, the control circuitry 1104 may be configured to utilize the precision-based verification technique by referencing the lookup table or flag register to verify that a current iteration is not a first iteration of the verify operation, and by verifying, during the current iteration, that a Vth of a memory does not have a position in an NVD that corresponds to a lower tail of the NVD. The precision-based verification technique may utilize the second set of bit line voltage biases or the second set of sense times.

In some embodiments, the control circuitry 1104 may determine to utilize the precision-based verification technique based on referencing the data structure (e.g., the lookup table) associated with the memory cells. For example, to utilize a verification technique to verify whether memory cell A has been programmed to data state A, the control circuitry 1104 may reference a third field of the lookup table. The third field, which corresponds to the third iteration of the verify operation, may store a lookup table value of zero, where the lookup table value corresponds to the precision-based verification technique. Thus, because the third field in the lookup table has the lookup table value of zero, the control circuitry 1104 is able to use the precision-based verification technique to verify whether memory cell A has been programmed to data state A.

In some embodiments, the control circuitry 1104 may determine whether the current iteration of the verify operation is likely to be a final iteration. For example, the control circuitry 1104 may reference the iteration counter that increments after each successive iteration of the verify operation has been completed. In this case, the control circuitry 1104 may be configured with a value identifying a total number of iterations and may compare the iteration counter value with the value identifying the final iteration (or identifying the total number of iterations) to determine whether the current iteration is the final iteration. If the current iteration is the final iteration, the control circuitry 1104 may perform the fast-programming verification technique. If the current iteration is not the final iteration, the control circuitry 1104 may perform the precision-based verification technique.

In the example shown, the iteration counter may have a value identifying that the current iteration is the third iteration. The control circuitry 1104 may compare the iteration counter to a configured value identifying the final iteration determine that the current iteration is not the final iteration, and may perform the precision-based verification technique based on the determination.

In some embodiments, the control circuitry 1104 may determine, for respective data states, which memory cells have yet to complete programming. For example, the control circuitry 1104 may determine, for each data state, specific memory cells that have yet to complete the program-verify operation. In this case, the control circuitry 1104 (e.g., by using or referencing a counting circuit) may perform the detection operation that counters the number of memory cells that have yet to complete programming. In the example shown, the control circuitry 1104 may compare the number of memory cells that remain to be programmed against the total number of memory cells for each data state. In this case, the control circuitry 1104 may determine to perform the precision-based verification technique based on the number of memory cells that have yet to complete programming satisfying a threshold criteria, such as a criteria that at least two memory cells remain to be programmed.

In some embodiments, the control circuitry 1104 may reference respective flag registers for other memory cells (e.g., memory cell B, memory cell C, and memory cell D) and may determine that each memory cell is not to be verified during the fourth iteration of the verify operation.

As shown by reference number 1122, the control circuitry 1104 may use the precision-based verification technique to perform the third iteration of the verify operation. For example, the control circuitry 1104 may perform the third iteration of the verify operation by applying a second bit line voltage bias, of the second set of bit line voltage biases, to the bit line connecting with memory cell A, by applying a third verify voltage, of the set of verify voltages, to the selected word line, and/or by verifying whether memory cell A has a threshold voltage above the third verify voltage.

In some embodiments, the control circuitry 1104 may update the iteration counter based on performing the third iteration of the verify operation. For example, the control circuitry 1104 may increment the iteration counter from a value of two to a value of three.

In this way, the control circuitry 1104 performs the third iteration of the verify operation using the precision-based verification technique.

Figure 11E:
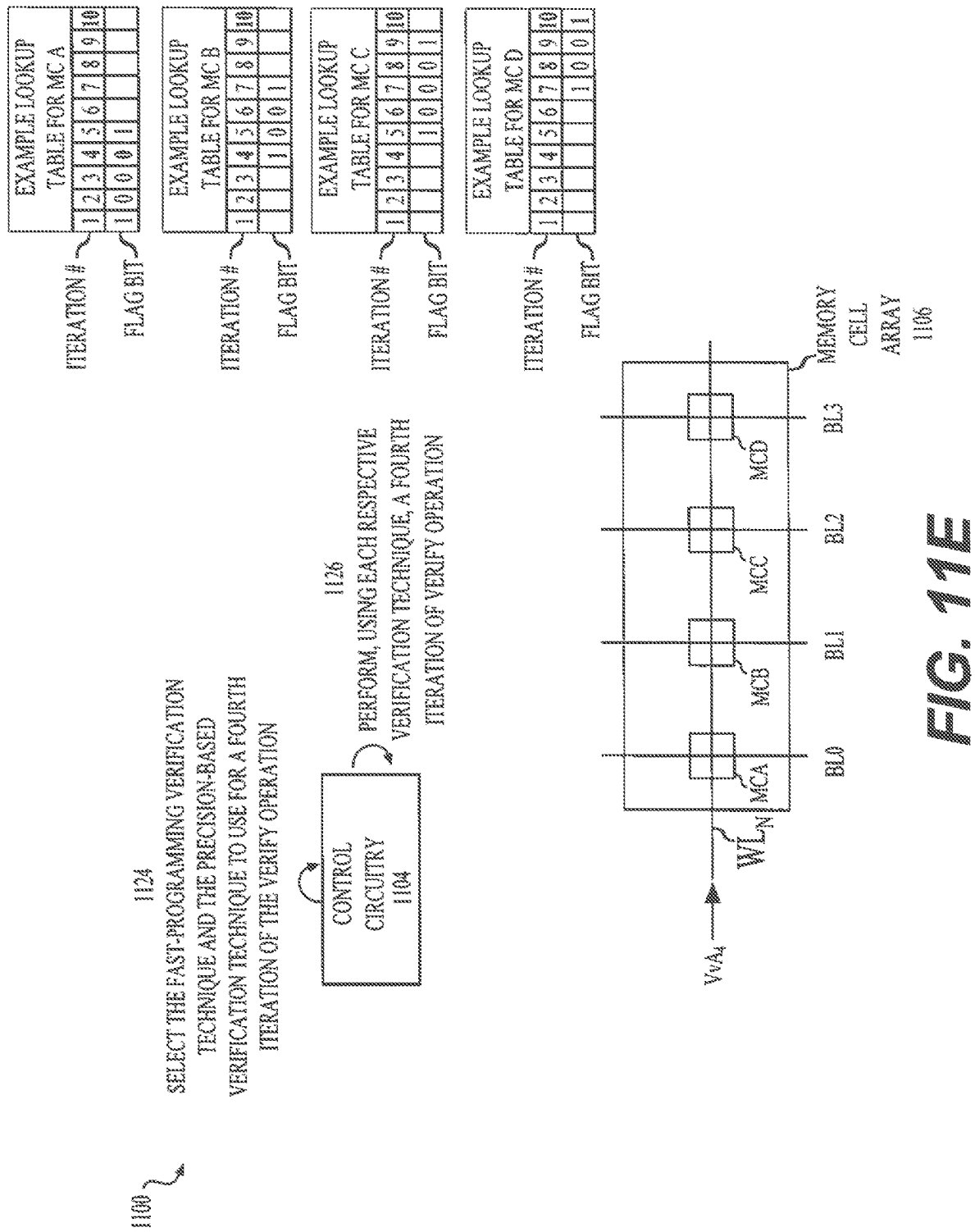

As shown in FIG. 11E by reference number 1124, the control circuitry 1104 may be configured to utilize the fast-programming verification technique and the precision-based verification technique for a fourth iteration of the verify operation. For example, the control circuitry 1104 may be configured to utilize the fast-programming verification technique for verifying whether memory cell B has been programmed to data state B and may be configured to utilize the precision-based verification technique for verifying whether memory cell A has been programmed to data state A.

In some embodiments, the control circuitry 1104 may determine to utilize the precision-based verification technique for verifying whether memory cell A has been programmed to data state A and the fast-programming verification technique for verifying whether memory cell B has been programmed to data state B. This determination may be made by referencing the data structure (e.g., the lookup table) associated with the memory cells. For example, the control circuitry 1104 may reference a fourth field of a first row of the lookup table. The fourth field of the first row, which corresponds to the fourth iteration of the verify operation, may store a lookup table value of zero, where the lookup table value corresponds to the precision-based verification technique.

Additionally, the control circuitry 1104 may reference a fourth field of a second row of the lookup table. The fourth field of the second row, which corresponds to the fourth iteration of the verify operation, may store a lookup table value of one, where the lookup table value corresponds to the fast-programming verification technique. Thus, because the fourth field in the first row has the lookup table value of zero and the fourth field of the second row has the lookup table value of one, the control circuitry 1104 is able to use the precision-based verification technique to verify memory cell A and the fast-programming verification technique to verify memory cell B.

In some embodiments, the control circuitry 1104 may determine whether the current iteration of the verify operation is likely to be the final iteration, as described above. In the example shown, the iteration counter may have a value identifying that the current iteration is the fourth iteration. The control circuitry 1104 may compare the iteration counter to a first configured value identifying the final iteration for verifying data state A, may determine that the current iteration is not the final iteration, and may perform the precision-based verification technique based on the determination.

In some embodiments, the control circuitry 1104 may determine, for respective data states, which memory cells have yet to complete programming, as described above. In the example shown, the control circuitry 1104 may compare the number of memory cells that remain to be programmed to a given data state against the total number of memory cells for that data state. In this case, the control circuitry 1104 may determine to perform the precision-based verification technique based on the number of memory cells that have yet to complete programming satisfying a threshold criteria, such as a criteria that at least two memory cells remain to be programmed.

In some embodiments, the control circuitry 1104 may reference respective flag registers for other memory cells (e.g., memory cell C and memory cell D) and may determine that each memory cell is not to be verified during the fourth iteration of the verify operation.

As shown by reference number 1126, the control circuitry 1104 may use the fast-programming verification technique and the precision-based verification technique to perform the fourth iteration of the verify operation. For example, the control circuitry 1104 may perform the fourth iteration of the verify operation by applying a second bit line voltage bias, of the second set of bit line voltage biases, to a bit line connecting with memory cell A, by applying a fourth verify voltage, of the set of verify voltages, to the selected word line, and/or by verifying whether memory cell A has a threshold voltage above the fourth verify voltage.

In some embodiments, the control circuitry 1104 may update the iteration counter based on performing the fourth iteration verify operation. For example, the control circuitry 1104 may reference the data structure and may increment the iteration counter to keep track of a current iteration of the verify operation. In the example shown, the control circuitry 1104 may update the iteration counter from a value of three to a value of four.

In this way, the control circuitry 1104 uses the fast-programming verification technique and the precision-based verification technique to perform the fourth iteration of the verify operation.

Figure 11F:
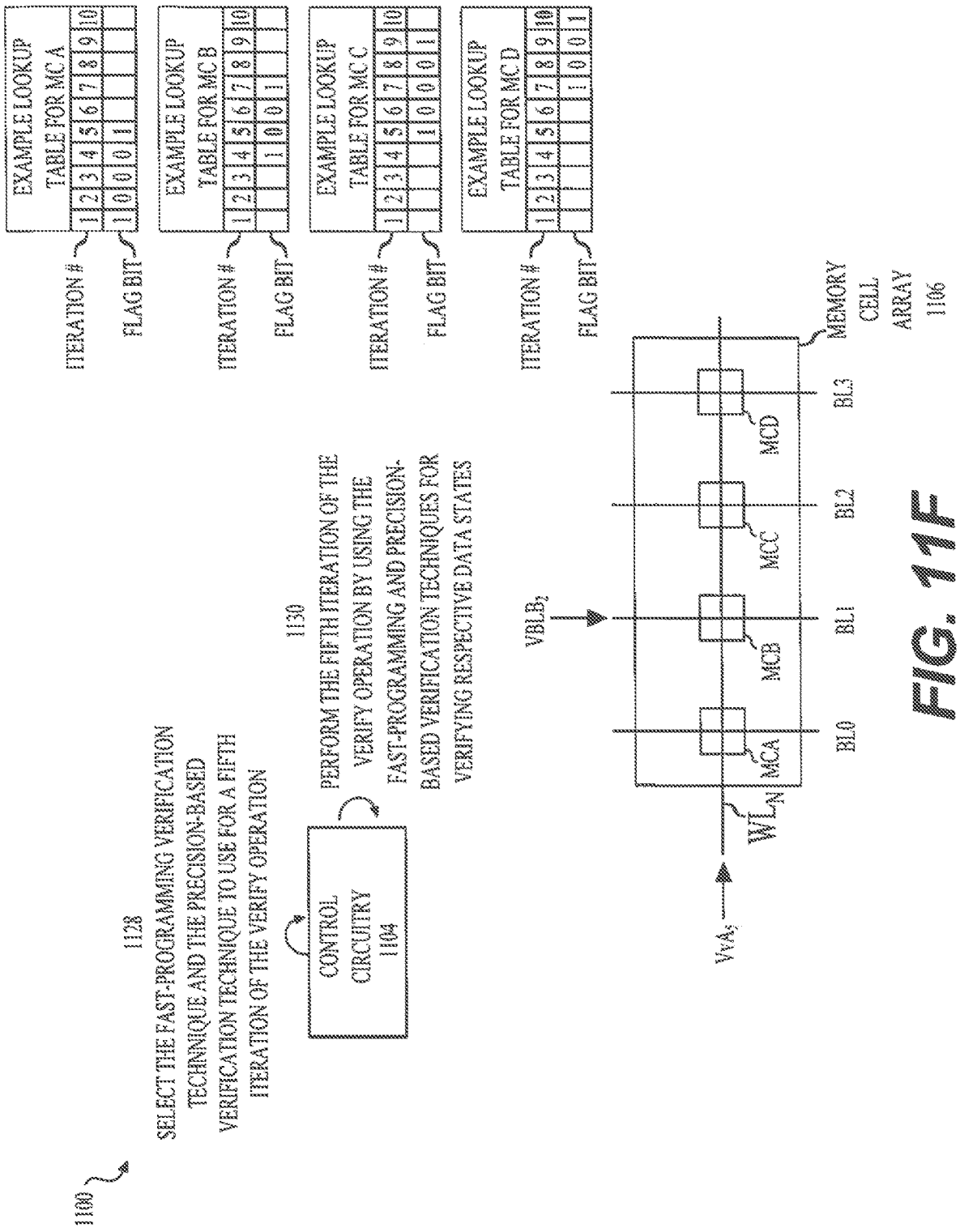

As shown in FIG. 11F by reference number 1128, the control circuitry 1104 may be configured to utilize the fast-programming verification technique and the precision-based verification technique for a fifth iteration of the verify operation. For example, the control circuitry 1104 may be configured to utilize the fast-programming verification technique for verifying whether memory cell A has been programmed to data state A and for verifying whether memory cell C has been programmed to data state C. Additionally, the control circuitry 1104 may be configured to utilize the precision-based verification technique for verifying whether memory cell B has been programmed to data state B.

In some embodiments, the control circuitry 1104 may determine to utilize the fast-programming verification technique for verifying whether memory cell A has been programmed to data state A. This determination may be made by referencing the data structure (e.g., the lookup table) associated with the memory cells. For example, the control circuitry 1104 may reference a fifth field of the first row of the lookup table. The fifth field of the first row, which corresponds to the fifth iteration of the verify operation, may store a lookup table value of one, where the lookup table value corresponds to the fast-programming verification technique.

Additionally, the control circuitry 1104 may reference a fifth field of the second row of the lookup table. The fifth field of the second row, which corresponds to the fifth iteration of the verify operation, may store a lookup table value of zero, where the lookup table value corresponds to the precision-based verification technique. Furthermore, the control circuitry 1104 may reference a fifth field of a third row of the lookup table. The fifth field of the third row, which corresponds to the fifth iteration of the verify operation, may store a lookup table value of one, where the lookup table value corresponds to the fast-programming verification technique. Thus, because the fifth field in the first and third row have the lookup table value of one and the fifth field of the second row has the lookup table value of zero, the control circuitry 1104 is able to use the fast-programming verification technique to verify memory cell A and memory cell C and is able to use the precision-based verification technique to verify memory cell B.

In some embodiments, the control circuitry 1104 may determine whether the current iteration of the verify operation is likely to be the final iteration, as described above. In the example shown, the iteration counter may have a value identifying that the current iteration is the fifth iteration. The control circuitry 1104 may compare the iteration counter to a first configured value identifying the final iteration for verifying data state A, may determine that the current iteration is the final iteration, and may perform the fast-programming verification technique based on the determination. Additionally, the control circuitry may perform a similar analysis for memory cell B and memory cell C, respectively.

In some embodiments, the control circuitry 1104 may determine, for respective data states, which memory cells have yet to complete programming, as described above. In the example shown, the control circuitry 1104 may compare the number of memory cells that remain to be programmed to data state A (e.g., one) against the total number of memory cells for that data state. In this case, the control circuitry 1104 may determine to perform the precision-based verification technique based on the number of memory cells that have yet to complete programming (e.g., one) failing to satisfy a threshold criteria, such as a criteria that at least two memory cells remain to be programmed. The control circuitry 1104 may determine to perform the fast-programming verify operation based on this determination. The control circuitry 1104 may perform a similar analysis for memory cell B and memory cell C, respectively (e.g., except the criteria may be satisfied and the precision-based verification technique may be performed).

In some embodiments, the control circuitry 1104 may reference respective flag registers for other memory cells (e.g., memory cell D, etc.) and may determine that each memory cell is not to be verified during the fifth iteration of the verify operation.

As shown by reference number 1130, the control circuitry 1104 may use the fast-programming and precision-based verification techniques to perform the fifth iteration of the verify operation. For example, the control circuitry 1104 may verify memory cell A by applying the second bit line voltage bias, of the first set of bit line voltage biases, to the bit line connecting with memory cell A, by applying the fifth verify voltage, of the set of verify voltages, to the selected word line, and/or by verifying whether memory cell A has a threshold voltage above the fifth verify voltage. The control circuitry 1104 may perform similar actions to verify memory cell B and memory cell C.

In some embodiments, the control circuitry 1104 may update the iteration counter based on performing the fifth iteration of the verify operation. For example, the control circuitry 1104 may increment the iteration counter from a value of four to a value of five.

While not shown, the control circuitry 1104 may also perform a sixth, seventh, eighth, and ninth iteration of the verify operation. The control circuitry 1104 may perform these iterations in a manner consistent with that described herein for other iterations of the verify operation.

As shown in FIG. 11G by reference number 1132, the control circuitry 1104 may be configured to utilize the fast-programming verification technique for a final iteration of the verify operation. For example, the control circuitry 1104 may be configured to utilize the fast-programming verification technique for verifying whether memory cell D has been programmed to data state D.

In some embodiments, the control circuitry 1104 may determine to utilize the fast-programming verification technique based on referencing the data structure (e.g., the lookup table) associated with the memory cells. For example, the control circuitry 1104 may reference a tenth field of a fourth row of the lookup table. The tenth field, which corresponds to the tenth iteration of the verify operation, may store a lookup table value of one, where the lookup table value corresponds to the fast-programming verification technique. Thus, because the tenth field in the fourth row of the lookup table has the lookup table value of one, the control circuitry 1104 is able to use fast-programming verification technique to verify whether memory cell D has been programmed to data state D.

In some embodiments, the control circuitry 1104 may determine whether the current iteration of the verify operation is likely to be the final iteration, as described above. In the example shown, the iteration counter may have a value identifying that the current iteration is the tenth iteration. The control circuitry 1104 may compare the iteration counter to configured values identifying the final iterations for each respective data state (e.g., iteration ten for data state D). The control circuitry 1104 may determine that the current iteration is the final iteration based on the comparison, and thus may perform the fast-programming verification technique.

In some embodiments, the control circuitry 1104 may determine, for data state D, which memory cells have yet to complete programming, as described above. In the example shown, the control circuitry 1104 may compare the number of memory cells that remain to be programmed to data state D (e.g., one) against the total number of memory cells for that data state. In this case, the control circuitry 1104 may determine to perform the precision-based verification technique based on the number of memory cells that have yet to complete programming (e.g., one) failing to satisfy a threshold criteria, such as a criteria that at least two memory cells remain to be programmed. The control circuitry 1104 may determine to perform the fast-programming verify operation based on this determination.

In some embodiments, the control circuitry 1104 may be configured to utilize the fast-programming verification technique for verifying memory cell D based on the iteration of the verify operation a sixth iteration. For example, the control circuitry 1104 may compare an iteration counter value with a configured final iteration value and may be configured to utilize the fast-programming verification technique based on the iteration counter value matching the final iteration value.

As shown by reference number 1134, the control circuitry 1104 may perform the final iteration of the verify operation. For example, the control circuitry 1104 may perform the final iteration of the verify operation by applying a third bit line voltage bias, of the second set of bit line voltage biases, to a bit line connecting with memory cell D, by applying a sixth verify voltage, of the set of verify voltages, to the selected word line, and/or by verifying whether memory cell D has a threshold voltage above the sixth verify voltage.

In some embodiments, the control circuitry 1104 may update the iteration counter based on performing the final iteration of the verify operation. For example, the control circuitry 1104 may increment the iteration from a value of five to a value of six.

In this way, the control circuitry 1104 selectively switches between fast-programming and precision-based verification techniques while verifying memory cells in the selected word line. By applying different verification techniques to memory cells during different iterations of the verify operation, the control circuitry 1104 reduces a total program-verify time while retaining the programming accuracy associated with using the precision-based verification technique. By reducing a total time to program and verify the memory cells, the control circuitry 1104 conserves resources (e.g., power resources, processing resources, memory resources, and/or the like) that would have otherwise be expended programming and verifying the memory cells using only the precision-based verification technique.

Figure 12:
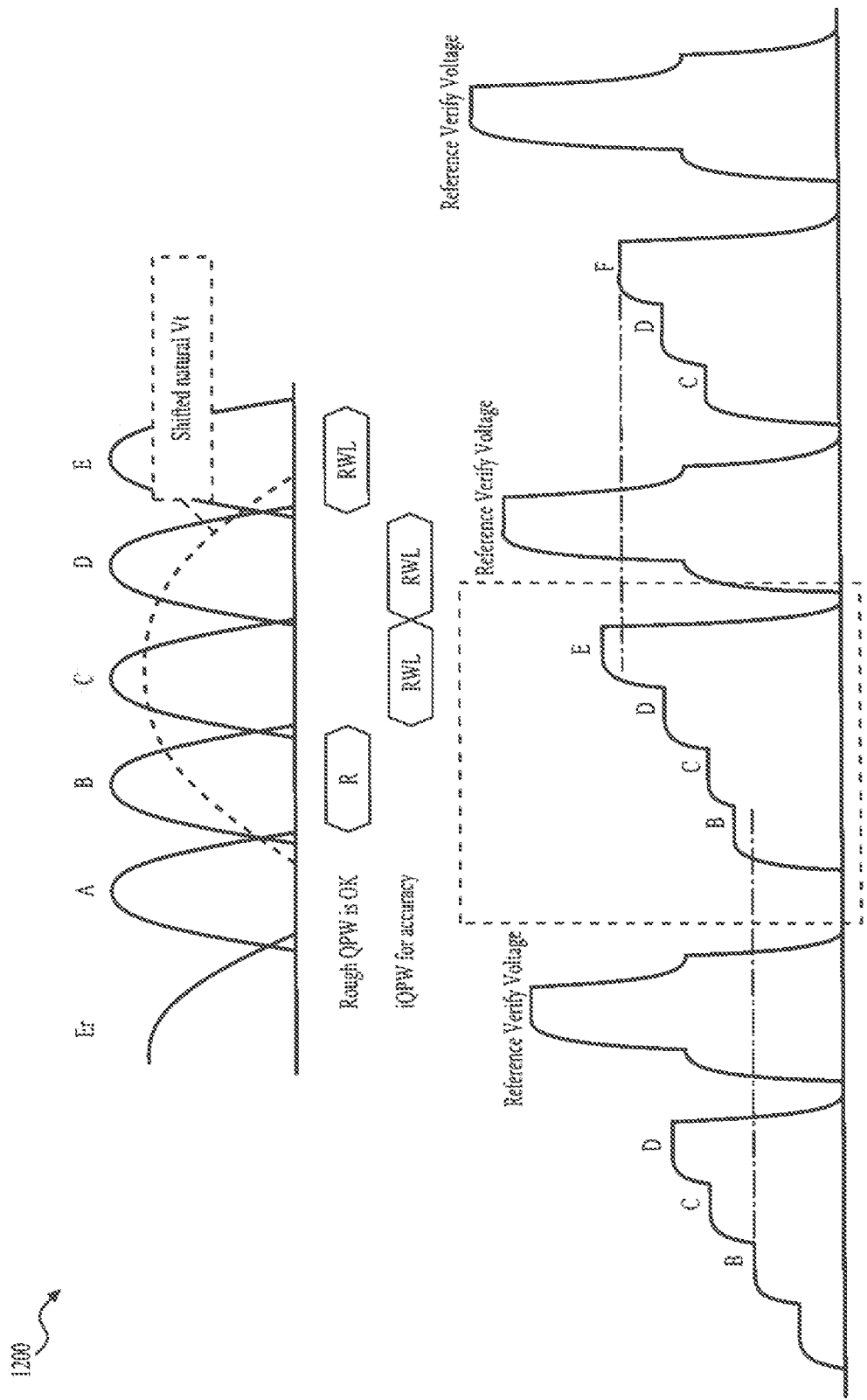
FIG. 12 is a diagram illustrating voltages of different verification techniques that are used to verify data states of memory cells.

FIG. 12 is a diagram illustrating voltages of different verification techniques that are used to verify data states of memory cells. As shown in the top-portion of the page, rough QPW technique may be implemented for an upper tail and a lower tail of the NVD and an iQPW technique may be implemented for the middle portion of the NVD. By implementing the rough QPW technique on the tails of the NVD, and by implementing the iQPW technique on the middle of the NVD, the NVD shifts to the right (as shown by the dotted line).

As shown, some of the reference verification voltage levels corresponding to rough QPK are different than voltage levels corresponding to iQPK. For example, as shown, the reference verification voltage values for iQPK are slightly higher for data state B and E, respectively (relative to corresponding rough QPK reference verification voltage values). Reference verification voltages are also shown in FIG. 11B using $VvA_1$ and $VvA_2$.

By verifying the memory cells using multiple verification techniques, the memory cells may be verified both quickly and accurately, and Vth's for data states of respective memory cells may be narrower (e.g., relative to an inferior verification, relative to using the fast-programming verification technique exclusively, etc.).

Figure 13:
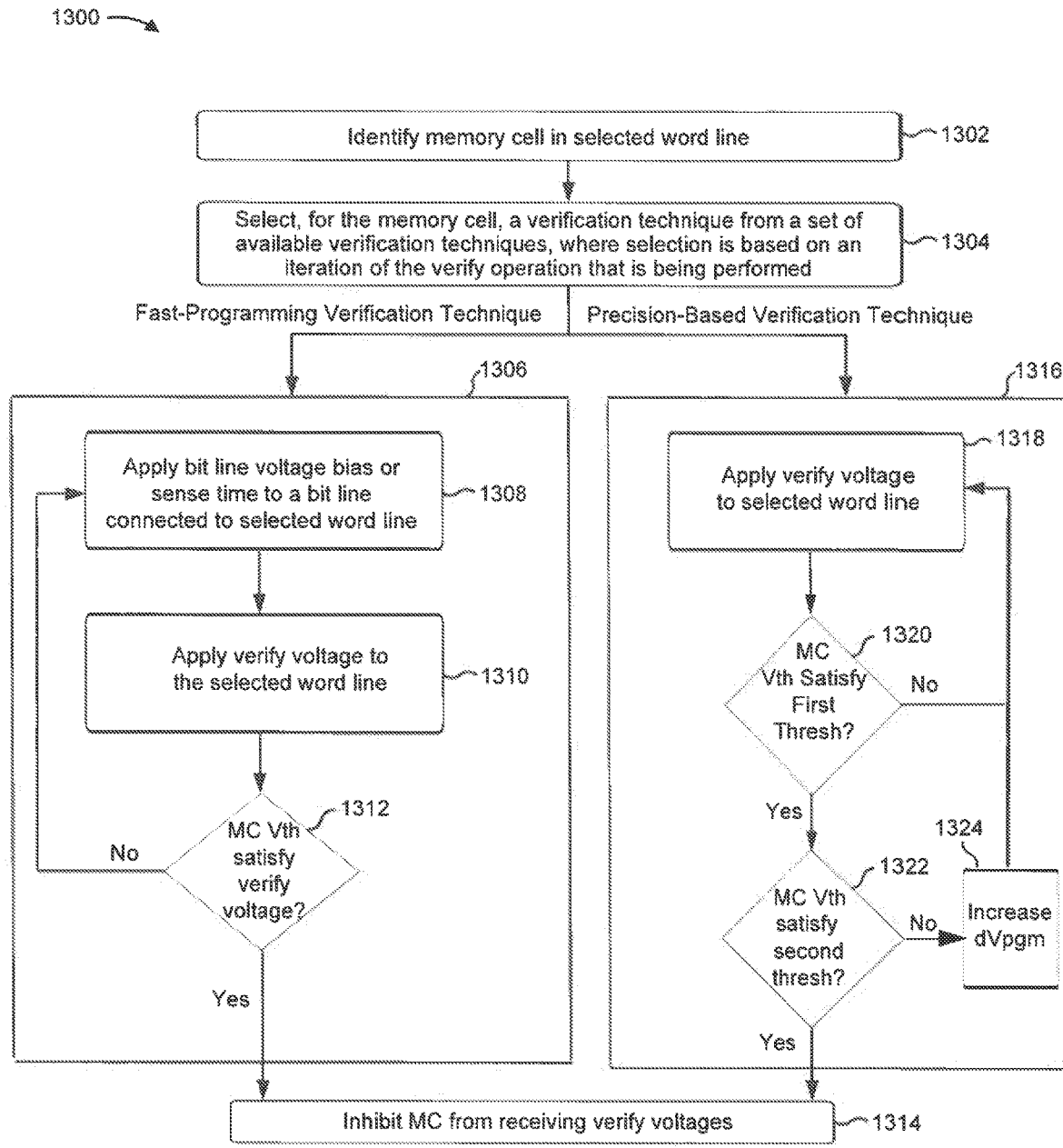
FIG. 13 is a flow diagram illustrating a method for selectively switching between verify techniques to verify whether a set of memory cells have been programmed, according to the principles of the present disclosure.

FIG. 13 is a flow diagram illustrating a method for selectively switching between verify techniques to verify whether a set of memory cells have been programmed, according to the principles of the present disclosure. Step 1302 identifies a memory cell in a selected word line. Step 1304 selects, for the memory cell, a verification technique from a set of available verification techniques, where selection is based on an iteration of the verify operation that is being performed. The set of available verification techniques may, for example, include a fast-programming verification technique (shown by the box on the right hand side of FIG. 13), a precision-based verification technique (shown by the box on the left hand side of FIG. 13), and/or the like.

If the fast-programming verification technique is selected, step 1306 applies verify voltage values associated with a first verify sub-cycle of the fast-programming verification technique. The verify voltage values associated with the first verify sub-cycle may include word line verify voltage values, bit line voltage bias values, sense time values, and/or the like. For example, a first threshold voltage may be used to pre-charge the word line at a predetermined margin below a second threshold voltage (e.g., when the programmed cells are being verified relative to the second threshold voltage). As another example, one or more bit line voltage biases may be used to pre-charge one or more bit lines associated appropriate for sensing. This may allow a sensing operation (e.g., a read operation) to be performed on the memory cell.

Step 1308 determines whether the threshold voltage distribution (Vth) of the memory cell satisfies (e.g., is greater than) the first verify voltage threshold. For example, a sensing operation (e.g., a read operation) may be performed on the memory cell to determine whether the Vth of the memory cell satisfies the first verify voltage threshold.

If the Vth does not satisfy the first verify voltage threshold, step 1308 is repeated by applying bit line voltage biases or sense times to the bit line. If the Vth of the memory cell does not satisfy the first verify voltage threshold, step 1310 performs the next iteration of the program operation (e.g., which may first include incrementing Vpgm using a dVpgm value). Step 1310 may, in some embodiments, be performed only if there are no memory cells with a Vth that satisfy the first verify voltage threshold.

If the Vth of the memory cell satisfies the first verify voltage threshold, then step 1312 applies verify voltage values associated with a second verify sub-cycle of the fast-programming verification technique. The verify voltage values associated with the second verify sub-cycle may include word line verify voltage values, bit line voltage bias values, sense time values, and/or the like, where the verify voltage values in the second verify sub-cycle are offset from the verify voltage values in the second verify sub-cycle. For example, a second threshold voltage may be used to pre-charge the word line at a level relative to which sensing is to be performed. As another example, one or more bit line voltage biases may be used to pre-charge one or more bit lines associated appropriate for sensing.

Step 1314 determines whether the Vth of the memory cell satisfies (e.g., is greater than) the second verify voltage threshold. For example, the sense operation may be performed on the memory cell to determine whether the Vth of the memory cell satisfies the second verify voltage threshold.

If the Vth of the memory cell does not satisfy the first verify voltage threshold, step 1310 performs the next iteration of the program operation (e.g., which may first include incrementing Vpgm using a dVpgm value). If the Vth of the memory cell satisfies the first verify voltage threshold, then step 1312 applies verify voltage values associated with a second verify sub-cycle of the fast-programming verification technique.

The verify voltage values associated with the second verify sub-cycle may include word line verify voltage values, bit line voltage bias values, sense time values, and/or the like, where the verify voltage values in the second verify sub-cycle are offset from the verify voltage values in the second verify sub-cycle. For example, a second threshold voltage may be used to pre-charge the word line at a level relative to which sensing is to be performed. As another example, one or more bit line voltage biases may be used to pre-charge one or more bit lines to voltages appropriate for sensing.

Step 1314 determines whether the Vth of the memory cell satisfies a second verify voltage threshold. If the Vth of the memory cell does not satisfy the second verify voltage threshold, then step 1310 performs the next iteration of the programming operation. If the Vth of the memory cell does satisfy the second verify voltage threshold, then step 1316 inhibits the memory cell from receiving additional verify voltages.

If the precision-based verification technique is selected, step 1318 applies verify voltage values associated with a first verify sub-cycle of the precision-based verification technique. The verify voltage values associated with the first verify sub-cycle of the precision-based verification technique may include word line verify voltage values, bit line voltage bias values, sense time values, and/or the like. For example, a first threshold voltage may be used to pre-charge the word line at a predetermined margin below a second threshold voltage (e.g., when the programmed cells are being verified relative to the second threshold voltage). As another example, one or more bit line voltage biases may be used to pre-charge one or more bit lines associated appropriate for sensing. This may allow a sensing operation (e.g., a read operation) to be performed on the memory cell.

Step 1320 compares the Vth of the memory cell with the first verify voltage threshold. For example, a sensing operation (e.g., a read operation) may be performed on the memory cell to compare the Vth of the memory cell with the first verify voltage threshold.

Step 1322 applies verify voltage values associated with the second verify sub-cycle. Step 1324 includes comparing the Vth of the memory cell with the second verify threshold. Step 1326 includes determining whether the Vth of the memory cell satisfies both verify voltage thresholds. If not, step 1328 may perform the next iteration of the program operation. While not shown, dVpgm may be increased if, for example, the Vth of the memory cell satisfies the first verify threshold but not the second verify threshold. If so, step 1316 inhibits the memory cell from receiving additional verify voltages.

As used herein, the verify operation may be a verify portion of a program-verify operation.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

Additionally, when a layer or element is referred to as being "on" another layer or substrate, in may be directly on the other layer of substrate, or intervening layers may also be present. Further, it will be understood that when a layer is referred to as being "under" another layer, it may be directly under, and one or more intervening layers may also be present. Furthermore, when a layer is referred to as "between" two layers, it may be the only layer between the two layers, or one or more intervening layers may also be present.

As described herein, a controller includes individual circuit components, an application-specific integrated circuit (ASIC), a microcontroller with controlling software, a digital signal processor (DSP), a processor with controlling software, a field programmable gate array (FPGA), or combinations thereof.

What is claimed is:

1. A non-volatile memory device, comprising:
   control circuitry for verifying whether memory cells have been programmed, wherein the memory cells are part of an array of memory cells of the non-volatile memory device, and wherein the control circuitry is configured to:
      use a verification technique, that is part of a set of verification techniques, to verify data states of a set of memory cells of a selected word line, wherein the verification technique is utilized based on an iteration of a program-verify operation that is being performed;
      perform, using the verification technique, a next-iteration of the program-verify operation to verify whether one or more memory cells of the set of memory cells of the selected word line have been programmed, wherein using the verification technique and performing the next-iteration of the program-verify operation are to be repeated until the set of memory cells have been verified.

2. The non-volatile memory device as set forth in claim 1, wherein the verification technique is a fast-programming verification technique using a one-step verification or a precision-based verification technique using multiple verification steps.

3. The non-volatile memory device as set forth in claim 2, wherein the verification technique is the fast-programming verification technique for a first and last iteration of the program-verify operation and is the precision-based verification technique for a middle set of iterations of the program-verify operation.

4. The non-volatile memory device as set forth in claim 2, wherein the fast-programming verification technique is used for a memory cell based on a threshold voltage distribution (Vth) of the memory cell having a position in a natural threshold voltage distribution (NVD) that corresponds with an upper or lower tail of the NVD.

5. The non-volatile memory device as set forth in claim 2, wherein the precision-based verification technique is used for a memory cell based on a threshold voltage distribution (Vth) of the memory cell having a position in a natural threshold voltage distribution (NVD) that corresponds with a middle portion of the NVD.

6. The non-volatile memory device as set forth in claim 1, wherein the control circuitry, when using the verification technique, is configured to:
   set a flag bit included in flag registers corresponding to a currently verified data state, wherein fields in a flag register include a first value corresponding to a fast-programming verification technique and a second value corresponding to precision-based verification technique.

7. The non-volatile memory device as set forth in claim 1, wherein the control circuitry is further configured to:
   increment an iteration counter based on performing the next-iteration of the program-verify operation, such that the iteration counter identifies a number of iterations of the program-verify operation that have been performed, wherein the iteration counter corresponds to a lower tail of a natural voltage threshold distribution (NVD).

8. A method of verifying whether one or more memory cells of a non-volatile memory have been programmed, the method comprising:
   utilizing one or more verification techniques, that are part of a set of verification techniques, to verify data states of a set of memory cells of a selected word line, wherein the one or more verification techniques are selected for use based on an iteration of a program-verify operation that is to be performed;
   performing, using the one or more verification techniques, a next-iteration of the program-verify operation to verify whether one or more memory cells of the set of memory cells of the selected word line are programmed, wherein using the one or more verification techniques and performing the next-iteration of the program-verify operation are to be repeated until the set of memory cells have been verified.

9. The method as set forth in claim 8, wherein the verification technique is a fast-programming verification technique using a one-step verification or a precision-based verification technique using multiple verification steps.

10. The method as set forth in claim 9, wherein the verification technique is the fast-programming verification technique for a first and last iteration of the program-verify operation and is the precision-based verification technique for a middle set of iterations of the program-verify operation.

11. The method as set forth in claim 9, wherein the precision-based verification technique is used for a memory cell based on a threshold voltage distribution (Vth) of the memory cell having a position in a natural threshold voltage distribution (NVD) that corresponds with a middle portion of the NVD.

12. The method as set forth in claim 9, wherein the fast-programming verification technique is a rough quick pass write (QPW) technique, and wherein the precision-based verification technique is an iQPW technique.

13. The method as set forth in claim 8, wherein utilizing the one or more verification techniques comprises:

set a flag bit included in flag registers corresponding to a currently verified data state, wherein fields in a flag register include a first value corresponding to a fast-programming verification technique and a second value corresponding to precision-based verification technique.

14. The method as set forth in claim 8, further comprising:
incrementing an iteration counter based on performing the next-iteration of the program-verify operation, such that the iteration counter identifies a number of iterations of the program-verify operation that have been performed, wherein the iteration counter corresponds to a lower tail of a natural voltage threshold distribution (NVD).

15. A device, comprising:
control circuitry for verifying whether memory cells have been programmed, wherein the memory cells are part of an array of memory cells of a non-volatile memory, and wherein the control circuitry is configured to:
use one or more verification techniques as part of a program-verify operation that is to be performed on one or more memory cells that are part of a set of memory cells of a selected word line,
wherein the one or more verification techniques are utilized based on an iteration of the program-verify operation that is to be performed; and
perform, using the one or more verification techniques, a next-iteration of the program-verify operation to verify whether the one or more memory cells are programmed, wherein using the one or more verification techniques and performing the next-iteration of the program-verify operation are to be repeated until the set of memory cells have been verified.

16. The device as set forth in claim 15, wherein the one or more verification techniques includes a fast-programming verification technique and a precision-based verification technique.

17. The device as set forth in claim 15, wherein the control circuitry, when using the one or more verification techniques, is configured to:
use, for a memory cell of the one or more memory cells, the one or more verification techniques based on whether the position of the memory cell is within a first range of positions correlating with an upper tail of a natural threshold voltage distribution (NVD), a second range of positions correlating with a middle portion of the NVD, or a third range of positions correlating with a lower tail of the NVD.

18. The device as set forth in claim 17, wherein the first range of positions and the third range of positions correlate with a rough quick pass write (QPW) technique and the second range of positions correlates with an iQPW technique.

19. The device as set forth in claim 15, wherein the control circuitry, when using the one or more verification techniques, is configured to:
set a flag bit included in flag registers corresponding to a currently verified data state, wherein fields in a flag register include a first value corresponding to a fast-programming verification technique and a second value corresponding to precision-based verification technique.

20. The device as set forth in claim 15, wherein the control circuitry is further configured to:
increment an iteration counter based on performing the next-iteration of the program-verify operation, such that the iteration counter identifies a number of iterations of the program-verify operation that have been performed, wherein the iteration counter corresponds to a lower tail of a natural voltage threshold distribution (NVD).

\* \* \* \* \*